United States Patent [19]

Nakagawa et al.

[11] Patent Number: 4,860,327
[45] Date of Patent: Aug. 22, 1989

[54] LATCH CIRCUIT CONSTRUCTED WITH MOS TRANSISTORS AND SHIFT REGISTER USING THE LATCH CIRCUITS

[75] Inventors: Kaoru Nakagawa, Yokohama; Katsushi Nagaba, Kawasaki, both of Japan

[73] Assignee: Kabushiki Kaisha Toshiba, Kawasaki, Japan

[21] Appl. No.: 201,187

[22] Filed: Jun. 2, 1988

[30] Foreign Application Priority Data

Jun. 3, 1987 [JP] Japan .................................. 62-139406

[51] Int. Cl.$^4$ ...................... G11C 11/40; H03K 3/356; H03K 23/44
[52] U.S. Cl. ...................................... 377/79; 307/279; 377/121
[58] Field of Search ...................... 377/73, 74, 78, 79, 377/121; 307/279

[56] References Cited

U.S. PATENT DOCUMENTS

| | | | |
|---|---|---|---|
| 3,829,712 | 8/1974 | Hama | 377/121 |
| 4,057,741 | 11/1977 | Piguet | 377/79 |
| 4,558,237 | 12/1985 | Rabe et al. | 307/279 |
| 4,568,842 | 2/1986 | Koike | 377/121 |
| 4,638,187 | 1/1987 | Boler et al. | 307/451 |

Primary Examiner—John S. Heyman
Attorney, Agent, or Firm—Finnegan, Henderson, Farabow, Garrett, & Dunner

[57] ABSTRACT

A first circuit is made up of a first clocked inverter and a first modified clocked inverter. A second circuit is made up of a second clocked inverter and a second modified clocked inverter. The first circuit has substantially the same circuit arrangement as that of the second circuit. The first circuit operates in response of the output signal from the second circuit, and vice versa.

16 Claims, 16 Drawing Sheets

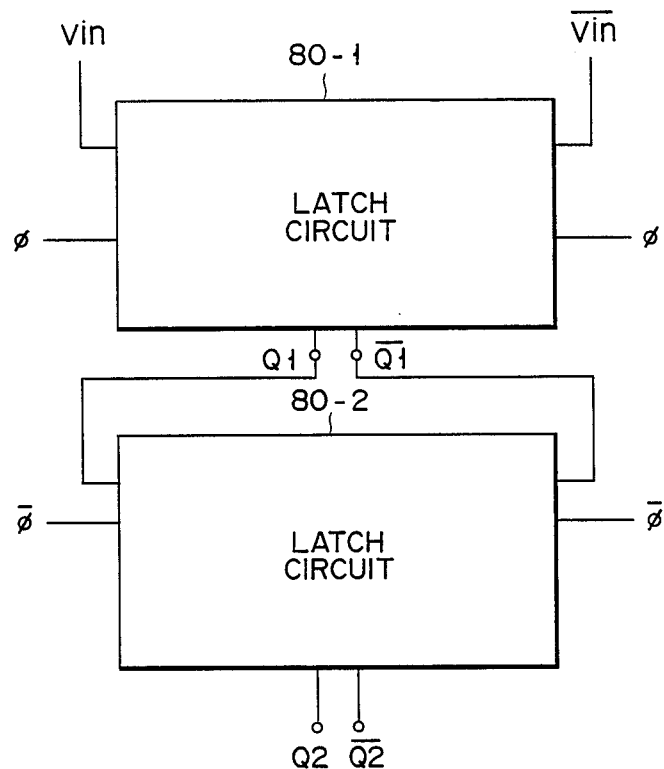
F I G. 25

LATCH CIRCUIT CONSTRUCTED WITH MOS TRANSISTORS AND SHIFT REGISTER USING THE LATCH CIRCUITS

BACKGROUND OF THE INVENTION

1. Field of the Invention

This invention relates to a semiconductor integrated circuit constructed with MOS transistors, and more particularly to a latch circuit and a shift register, which are used in the output stage of an image memory.

2. Description of the Related Art

An operation speed of the image memory is very high. For example, a cycle time of the image memory is approximately several tens ns. A latch circuit for the data outputting must be operable at a high speed and with a good reliability.

A conventional data output latch circuit in use with an image memory is as illustrated in FIG. 1. The latch circuit is comprised of first latch section 10 and second latch section 20. First latch section 10 includes clocked inverter 11 controlled by a pair of clock signals $\phi$ and $\bar{\phi}$, and flip-flop 14 coupled at the input terminal with the output terminal of clocked inverter 11. Flip-flop 14 is made up of complementary type inverter 12 and clocked inverter 13. Clocked inverter 13 is coupled at the input terminal with the output terminal of inverter 12 and at the output terminal with the input terminal of the inverter, and is controlled by a pair of clocked signals $\bar{\phi}$ and $\phi$. Second latch section 20 includes clocked inverter 21 controlled by clock signals $\phi$ and $\bar{\phi}$, and flip-flop 24 connected at the input terminal with the output terminal of clocked inverter 21. Flip-flop 24 is made up of complementary type inverter 22 and clocked inverter 23. Clocked inverter 23 is connected at the input terminal with the output terminal of inverter 22, and at the output terminal with the input terminal of the inverter, and is controlled by clock signals $\bar{\phi}$ and $\phi$. Input signal Vin is directly input to latch section 10. Input signal Vin is also input to latch section 20, after passed through and inverted by inverter 25. The output terminal of latch section 10 is connected to the gate of N channel MOS transistor 27 as a load transistor, which partially constitutes output circuit 26. The output terminal of latch section 20 is connected to the gate of N channel MOS transistor 28 as a drive transistor.

The details of latch section 10 or 20 are illustrated in FIG. 2. Clock signal $\phi$ is applied to the gate of N channel MOS transistor QN2 as a switching transistor for clocked inverter 11 and the gate of P channel MOS transistor QP4 as a switching transistor for clocked inverter 13. Clock signal $\bar{\phi}$ is applied to the gate of P channel MOS transistor QP2 as a switching transistor in clocked inverter 11 and the gate of N channel MOS transistor QN4 as a switching transistor in clocked inverter 13.

The operation of the data output latch circuit of FIG. 1 thus arranged will be described.

In a first period, clock signal $\phi$ is in high ("H") level and clock signal $\bar{\phi}$ is in low ("L"level. Clocked inverters 11 and 21 execute the inverter operation, to invert and delay input signals Vin, and produce output signals Q and $\bar{Q}$.

In a second period, clock signal $\phi$ is changed from "H" to "L" in logical level, and clock signal $\bar{\phi}$ is changed from "L" to "H". Clocked inverters 11 and 21 do not execute the inverter operation, while clocked inverters 13 and 23 execute the inverter operation. As a result, the data thus far output are stored in flip-flops 14 and 24.

In a third period, clock signal $\phi$ is "L" in logical level and clock signal $\bar{\phi}$ is "H" in logical level. At this time, flip-flops 14 and 24 are operating, and hence continue to store the data therein. In this case, clocked inverters 11 and 21 do not operate. Accordingly, output signals Q and $\bar{Q}$ remain unchanged, even if input signal Vin varies.

In a fourth period, clock signal $\phi$ is changed from "L" to "H", and clock signal $\bar{\phi}$ is changed from "H" to "L". Clocked inverters 13 and 23 do not operate, while clocked inverters 11 and 21 operate to execute the inverter operation. Then, the latch sections 10 and 20 fetch new input signal Vin, and substantially simultaneously output the contents of the input signals, i.e., the data stored therein as output signals Q and E,ovs/Q/ .

A sequence of the operations of the first to fourth periods is repeated.

A timing chart illustrating the sequence of operations of the FIG. 1 circuit is shown in FIG. 3.

As described above, the conventional latch circuit uses the clocked inverters. Use of the clocked inverters needs opposite phase clock signals $\phi$ and $\bar{\phi}$ controlling this inverter. Practically, however, it is very difficult to generate the clock signals which are exactly out of phase in a continuous manner. To form such clock signals, a clock signal must be passed through an inverter. When passing through the inverter, the clock signal inevitably delays by some time-length. Therefore, the clock signal and the inverted clock signal propagate and reach a point at different times. If such staggered clock signals are applied to the clocked inverter, the clocked inverter is placed in a high impedance state during a transient period that the input-signal outputting mode is changed to the output-signal holding mode. This high impedance state is peculiar to the clocked inverter. In such a high impedance state, the output data is possibly inverted, leading to a malfunction operation of the inverter.

Why the high impedance state occurs in the clocked inverter and what the phenomenon brings about, will be described below.

In FIG. 2, when input signal Vin is 37 H", clock signal $\phi$ is "H", and inverted clock signal $\bar{\phi}$ is 37 L", MOS transistors QN1, QN2, and QP2 are turned on, while transistors QP1, QP4 and QN4 are turned off. Accordingly, node NA is "L", transistor QP5 is turned on, and transistor QN5 is turned off, output Q provides an "H" level signal, transistor QP3 is turned off, and transistor QN3 is turned on.

If clock signals $\phi$ and $\bar{\phi}$ are both "L" while input signal Vin is kept high, then MOS transistors QP1, QP3 and QN2, and QN4 are turned off, and transistors QP2, QP4, QN1 and QN3 are turned on. Under this condition, both the clocked inverters 11 and 13 do not operate, and node NA is at high impedance. At the initial stage in the operation, node NA maintains the previous potential, i.e., "L" level. At this time, the transistors QP2 and QP4 in the clocked inverter are in an on state. If the potential at node N3 is high, the high potential is transferred to node NA, so that the potential at node NA goes high. If the potential increase is large, transistor QP5 is turned off, and transistor QN5 is turned on. Finally, the logical state at output Q is inverted.

When input signal Vin is "L", clock signal $\phi$ is "H", and clock signal $\bar{\phi}$ is "L", MOS transistors QP1, QP2 and QN2 are turned on, and transistors QN1, QN4 and QP4 are turned off. Accordingly, the potential at node NA goes high. Transistor QP5 is turned off, and transistor QN5 is turned on. Output Q provides an "L" level signal. Then, transistor QP3 is turned on and transistor QN3 is turned off.

While input signal Vin maintains the "L" state, clock signals $\phi$ and $\bar{\phi}$ go high. Then, MOS transistors QP1, QP3, QN2 and QN4 are turned on, and transistors QP2, QP4, QN1 and QN3 are turned off. Under this condition, clocked inverters 11 and 13 do not operate, and node NA is at a high impedance. At the initial stage in the operation, node NA maintains the previous potential, i.e., an "H" state. At this time, the transistors QN2 and QN4 in the clocked inverter are in an on state. If the potential at node N4 is low, the low potential is transferred to node NA, so that the potential at node NA goes low. If this potential drop is large, MOS transistors QP5 is turned on, and transistor QN5 is turned off. Finally, the logical state of the data at output Q is inverted.

Latch sections 10 and 20 are followed by output circuit 26, as shown in FIG. 1. Output circuit 26 is made up of N channel MOS transistor 27 as a load transistor and N channel MOS transistor 28 as a drive transistor. The gates of these transistors 27 and 28 are controlled by the output signals Q and $\bar{Q}$ of latch sections 10 and 20. With such a circuit arrangement, when the output potential is inverted as described above, load transistor 27 and drive transistor 28 are both in an on state, so that a rush-current flows between the power source terminals. With this rush-current, the power dissipation is greatly increased, particularly when the memory device including the output circuit operates at a high speed. This further provides an instable power source voltage of the device.

Further, even if clock signals $\phi$ and $\bar{\phi}$ are perfectly opposite phase, and the level variations simultaneously occur at both the outputs Q and $\bar{Q}$, it is impossible to prevent the rush-current from flowing in the output circuit 26 during this transient period.

Particularly in the image memory in which the serial access is performed with a short cycle time, the increased power dissipation due to the rush-current is not negligible.

SUMMARY OF THE INVENTION

Accordingly, an object of this invention is to provide a latch circuit which is free from the high impedance problem at the output node in the clocked inverter, and substantially free from the transient variation problem of the complementary output signals, and ensures a stable operation at a high speed, and consumes a less amount of power, and to provide a shift register using such latch circuits.

Another object of this invention is to provide two types of latch circuits controlled by a single-phase clock signal, and a shift register which is made up of a combination of these latch circuits and controlled by a single-phase clock signal.

According to one aspect of this invention, there is provided a latch circuit comprising: first and second transistors of a first conductivity type whose current paths are connected in series between a first power source and a first node, a gate of one of the first and second transistors coupled for reception with a first input signal, and a gate of the other transistor being coupled with a first signal output terminal; third and fourth transistors of a second conductivity type whose current paths are connected in series between the first node and a second power source, a gate of one of the third and fourth transistors coupled for reception with a clock signal, and a gate of the other transistor being coupled for reception with the first input signal; fifth and sixth transistors of the first conductivity type whose current paths are connected in series between the first power source and a second node which is then connected to the first node, a gate of one of the fifth and sixth transistors coupled with the first signal output terminal, and a gate of the other transistor being coupled for reception with the clock signal; a seventh transistor of the second conductivity type connected between the second node and the second power source, a gate of the seventh transistor being connected to the first signal output terminal; eighth and ninth transistors of the first conductivity type whose current paths are connected in series between the first power source and a third node which is then connected to the first signal output terminal, a gate of one of the eighth and ninth transistors coupled with a second signal output terminal which is then connected to the second node, and a gate of the other transistor being coupled for reception with the clock signal; a tenth transistor of the second conductivity type connected between the third node and the second power source, a gate of the tenth transistor being connected to the second signal output terminal; eleventh and twelfth transistors of the first conductivity type whose current paths are connected in series between the first power source and a fourth node which is then connected to the third node, a gate of one of the eleventh and twelfth transistors coupled for reception with a second input signal as the inversion of the first input signal, and a gate of the other transistor being coupled with the second signal output terminal; and thirteenth and fourteenth transistors of the second conductivity type whose current paths are connected in series between the fourth node and the second power source, a gate of one of the thirteenth and fourteenth transistors coupled for reception with the clock signal and a gate of the other transistor being coupled for reception with the second input signal.

According to another aspect of this invention, there is provided a shift register made up of a plurality of cascade connected latch circuits comprising: (a) a first latch circuit including; first and second transistors of a first conductivity type whose current paths are connected in series between a first power source and a first node, a gate of one of the first and second transistors coupled for reception with a first input signal, and a gate of the other transistor being coupled with a first signal output terminal; third and fourth transistors of a second conductivity type whose current paths are connected in series between the first node and a second power source, a gate of one of the third and fourth transistors coupled for reception with a clock signal, and a gate of the other transistor being coupled for reception with the first input signal; fifth and sixth transistors of the first conductivity type whose current paths are connected in series between the first power source and a second node which is then connected to the first node, a gate of one of the fifth and sixth transistors coupled with the first signal output terminal, and a gate of the other transistor being coupled for reception with the clock signal; a seventh transistor of the second conductivity type connected between the second node and the second power source, a gate of the seventh transistor being connected to the first signal output terminal; eighth and ninth transistors of the first conductivity type whose current paths are connected in series between the first power source and a third node which is then connected to the first signal output terminal, a gate of one of the eighth and ninth transistors coupled with a second signal output terminal which is then connected to the second node, and a gate of the other transistor being coupled for reception with the clock signal; a tenth transistor of the second conductivity type connected between the third node and the second power source, a gate of the tenth transistor being connected to the second signal output terminal; eleventh and twelfth transistors of the first conductivity type whose current paths are connected in series between the first power source and a fourth node which is then connected to the third node, a gate of one of the eleventh and twelfth transistors coupled for reception with a second input signal as the inversion of the first input signal, and a gate of the other transistor being coupled with the second signal output terminal; and thirteenth and fourteenth transistors of the second conductivity type whose current paths are connected in series between the fourth node and the second power source, a gate of one of the thirteenth and fourteenth transistors coupled for reception with the clock signal, and a gate of the other transistor being coupled for reception with the second input signal, and (b) a second latch circuit including; first and second transistors of a first conductivity type whose current paths are connected in series between a first power source and a first node, a gate of one of the first and second transistors coupled for reception with a first input signal, and a gate of the other transistor being coupled for reception with a clock signal; third and fourth transistors of a second conductivity type whose current paths are connected in series between the first node and a second power source, a gate of one of the third and fourth transistors coupled with a first signal output terminal, and a gate of the other transistor being coupled for reception with the first input signal; fifth transistor of the first conductivity type connected between the first power source and a second node which is then connected to the first node, a gate of the fifth transistor being coupled with the first signal output terminal; sixth and seventh transistors whose current paths are connected in series between the second node and the second power source, a gate of one of the sixth and seventh transistors connected for reception with the clock signal, a gate of the other transistor being connected to the first signal output terminal; an eighth transistor of the first conductivity type connected between the first power source and a third node which is then connected to the first signal output terminal, a gate of the eighth transistor being coupled with a second signal output terminal which is then connected to the second node; ninth and tenth transistors of the second conductivity type connected between the third node and the second power source, a gate of one of the ninth and tenth transistors connected for reception with the clock signal, and a gate of the other transistor being connected to the second signal output terminal; eleventh and twelfth transistors of the first conductivity type whose current paths are connected in series between the first power source and a fourth node which is then connected to the third node, a gate of one of the eleventh and twelfth transistors coupled for reception with the second input signal as the inversion of the first input signal, and the gate of the other transistor being coupled for reception with the clock signal; and thirteenth and fourteenth transistors of the second conductivity type whose current paths are connected in series between the fourth node and the second power source, a gate of one of the thirteenth and fourteenth transistors coupled with the second signal output terminal, and a gate of the other transistor being coupled for reception with the second input signal; the first and second latch circuits being connected to form a 1-bit shift register in such a way that the output signal of one of the first and second latch circuits is connected to the input of the other latch circuit. The shift register may be constructed with a desired number of 1-bit shift registers. In operation, an input signal is shifted by applying a control clock signal to the first and second latch circuits.

The latch circuit thus arranged will never encounter a situation that the second and third nodes are at a high impedance. Therefore, a malfunction potential variation will never occur in the output signal of the latch circuit. In this respect, the output signal is stabilized. Further, there will never occur such a situation that the complementary output signals at the first and second signal output terminals are simultaneously at the first supplied potential. This feature prevents the rush-current from flowing between the power source terminals of the output circuit connected to the output of the latch circuit. Additionally, the latch circuit may be controlled by a single-phase clock signal. This eliminates the need for a complicated clock signal generating circuit, leading to a good reliability circuit operation. The same thing is true for the shift register.

BRIEF DESCRIPTION OF THE DRAWINGS

FIG. 25 shows a block diagram of a shift register according to a fifth embodiment of this invention.

DETAILED DESCRIPTION OF THE PREFERRED EMBODIMENTS

Figure 1:
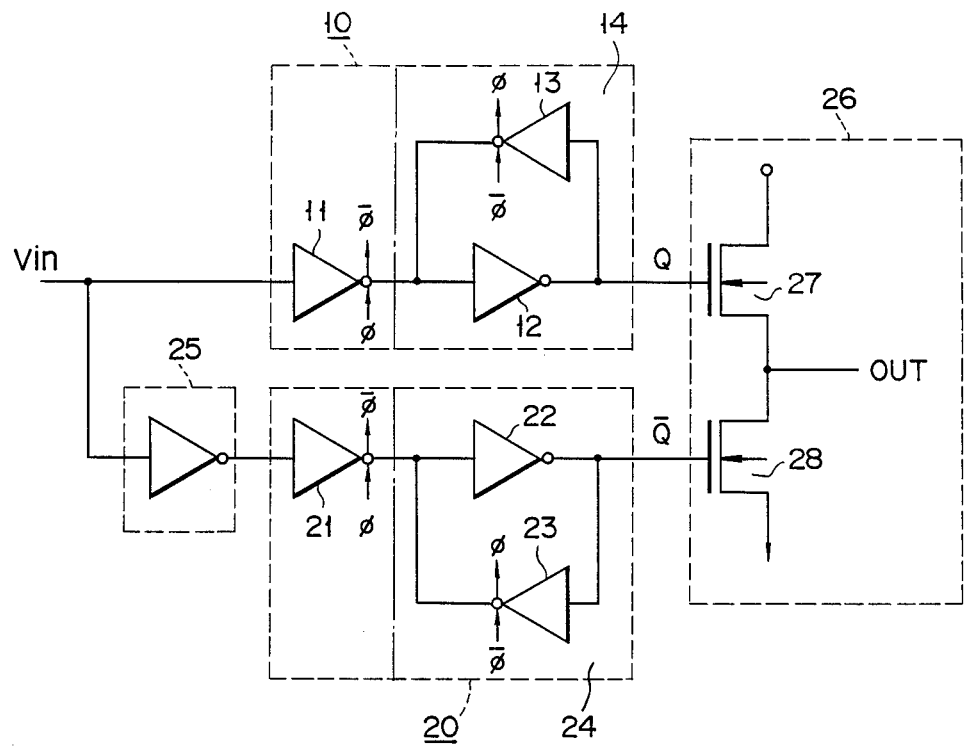
FIG. 1 is a block diagram showing a conventional data output latch circuit.
Figure 2:
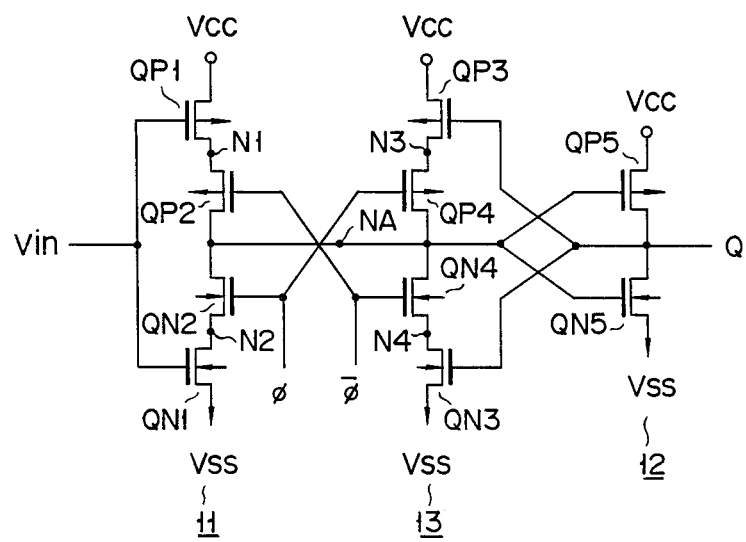
FIG. 2 is a circuit diagram showing the details of a part of the latch circuit of FIG. 1.
Figure 3:
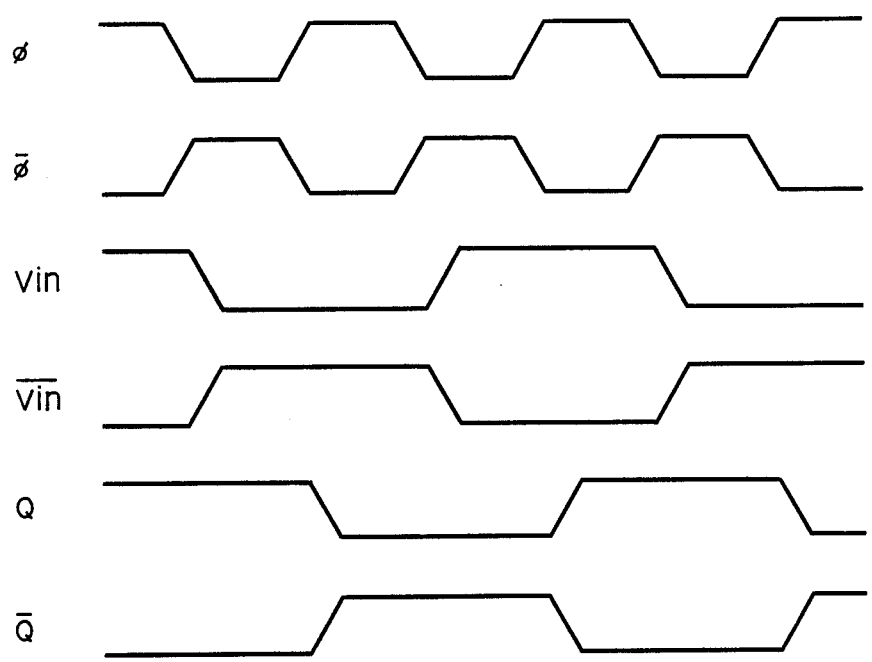
FIG. 3 shows a timing chart useful in explaining the operation of the circuit shown in FIG. 1.
Figure 4:
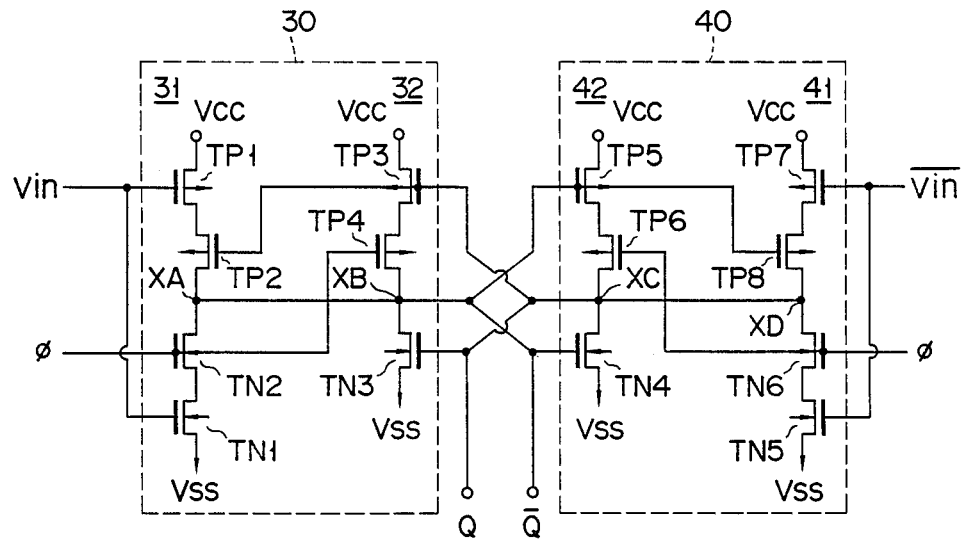
FIG. 4 is a circuit diagram of a latch circuit according to a first embodiment of the present invention.

Reference is first made to FIG. 4 showing a latch circuit according to a first embodiment of this invention. The latch circuit is improved in the following points. The latching operation is conducted in response to a single-phase clock signal. The high impedance phenomenon never occurs in the clocked inverter. The complementary output signals never simultaneously reach a logically high ("H") level.

This latch circuit is comprised of first and second circuits 30 and 40. First circuit 30 includes clocked inverter 31, and clocked inverter 32 of a modified type. Clocked inverter 31 is made up of P channel MOS transistors TP1 and TP2 having current paths which are connected in series between power source Vcc terminal and node XA, and N channel MOS transistors TN2 and TN1 having current paths which are connected in series between node XA and ground Vss terminal. Modified type clocked inverter 32 is made up of P channel type MOS transistors TP3 and TP4 aving current paths which are connected in series between power source Vcc terminal and node XB, and N channel MOS transistor TN3 having a current path which is connected between node XB and ground Vss terminal. Nodes XA and XB are interconnected. Second circuit 40 includes clocked inverter 41, and clocked inverter 42 of a modified type. Modified clocked inverter 42 is made up of a couple of P channel MOS transistors TP5 and TP6 having current paths which are connected in series between power source Vcc terminal and node XC, and N channel MOS transistors TN4 having a current path which is connected in series between node XC and ground Vss terminal. Clocked inverter 41 is made up of P channel type MOS transistors TP7 and TP8 having current paths which are connected in series between power source Vcc terminal and node XD, and N channel MOS transistors TN6 and TN5 having a current path which is connected between node XD and ground Vss terminal. Nodes XC and XD are interconnected.

The gates of the MOS transistors TP1 and TN1 of clocked inverter 31 in first circuit 30 are connected for receiving input signal Vin. The gates of N channel MOS transistor TN2 of inverter 31 and P channel MOS transistor TP4 of inverter 32 are connected for receiving clock signal (control signal) $\phi$. Input signal $\overline{Vin}$ as the inverse of the input signal Vin is applied to the gates of MOS transistors TP7 and TP5 of clocked inverter 41 in second circuit 40. Clock signal $\phi$ is applied to the gates of the N channel MOS transistor TN6 in clocked inverter 41, and the P channel MOS transistor TP6 of modified clocked inverter 42. Node XB in modified clocked inverter 32 is connected with the gates of the MOS transistors TP5 and TN4 in modified clocked inverter 42, and the gate of the MOS transistor TP8 in clocked inverter 41. The XC in inverter 42 is connected to the gates of MOS transistors TP3 and TN3 in inverter 32, and the gate of the MOS transistor TP2 in inverter 31. First output signal Q is derived from node XC, and second output signal $\overline{Q}$ as the inverse of output signal Q is output from node XB.

Figure 5:
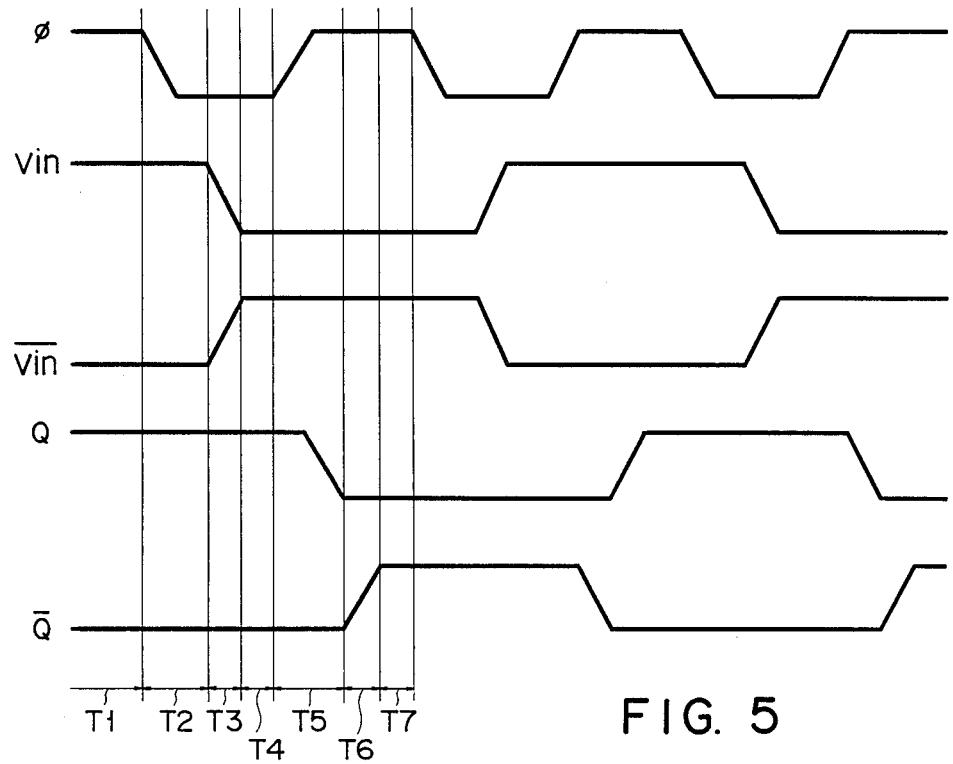
FIG. 5 shows a timing chart useful in explaining the operation of the circuit of FIG. 4.

The operation of the latch circuit of FIG. 4 will be described referring to a timing chart of FIG. 5.

In a first period (T1), clock signal $\phi$ and input signal Vin are both in an "H" level. During this period, MOS transistors TP1 to TP4, TP6, TN4 and TN5 are in an off state, while transistors TP5, TP7 TP8, TN1, TN2, TN3 and TN6 are in an on state. The outputs Q and $\overline{Q}$ are in "H" and "L" states, respectively.

When the memory cycle enters the phase of a second period (T2), clock signal $\phi$ is changed from an "H" level to an "L" level, and input signal Vin remains "H". MOS transistors TN2 and TN6 are turned off, and transistors TP4 and TP6 are turned on. Under these conditions, clocked inverter 31 stops its inverter operation, and modified clocked inverters 32 and 42 starts the inverter operation, or the flip-flop operation, to latch output signals Q and $\overline{Q}$.

In a third period (T3), clock signal $\phi$ is at an "L" level, and input signal Vin changes its logical state from "H" to 37 L". MOS transistors TP1 and TN5 are turned on, and transistors TN1 and TP7 are turned off. Under these conditions, the circuit is in a latched state, and rejects the input signals Vin and $\overline{Vin}$, and the output signals Q and $\overline{Q}$ remain unchanged.

In a fourth period (T4), clock signal $\phi$ is at an "L" level, and input signal Vin is also at an "L" level. The circuit is in a latched state, while maintaining the logical states of output signals Q and $\overline{Q}$.

In a fifth period (T5), clock signal $\phi$ changes its logical level from "L" to "H", and input signal Vin remains at an "L" level. MOS transistors TN2 and TN6 are turned on, and transistors TP4 and TP6 are turned off. As MOS transistors TN5 and TN6 are turned on, the potential at the output Q of second circuit 40 begins to drop.

In a sixth period (T6), clock signal $\phi$ is at "H" level, and input signal Vin is at an "L" level. Output Q is at an "L" level. MOS transistors TP2 and TP3 are turned on and transistor TN3 is turned off. As MOS transistors TP1 and TP2 are turned on, the potential at the output $\overline{Q}$ of first circuit 30 begins to increase.

In a seventh period (T7), clock signal $\phi$ is at an 37 H" level and input signal Vin is at an "L" level. Output $\overline{Q}$ is at an "H" level. MOS transistors TP5 and TP8 are turned off, and transistor TN4 is turned on. The inversion of the output signals Q and $\overline{Q}$ has been completed.

A sequence of the operations from first to seventh periods is repeated.

Figure 6A:
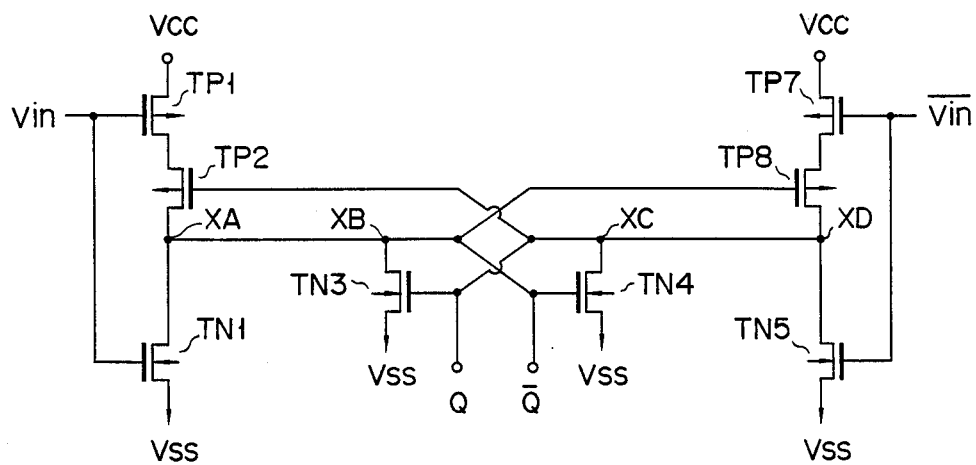
FIGS. 6A and 6B show the equivalent circuits of the circuit of FIG. 4 when it receives a clock signal in different logical states.

FIG. 6A shows an equivalent circuit of the circuit of FIG. 4 when clock signal $\phi$ is at an "H" level, that is, the logical state of the output signals are to be inverted based on the input signals. In the equivalent circuit, the transistors, which are normally in an on state when clock signal $\phi$ is in an "H" state, are expressed by conduction lines. The transistors which are normally in an off state, and those transistors which are disconnected from the circuit in the circuit operation as a result of turning-off the normally-off transistors, are omitted in the illustration. As seen from FIG. 6A, either of the transistors TN1 and TN5, when the gate of it is at an "H" level, is turned on. In turn, the voltage at the drain of the turned-on transistor drops. Then, the flip-flop starts to operate. The logical state of the other output signal is inverted. This fact indicates that this circuit allows both the outputs to simultaneously be at an "L" level, but it prohibits them to simultaneously be at an "H" level.

Figure 6B:
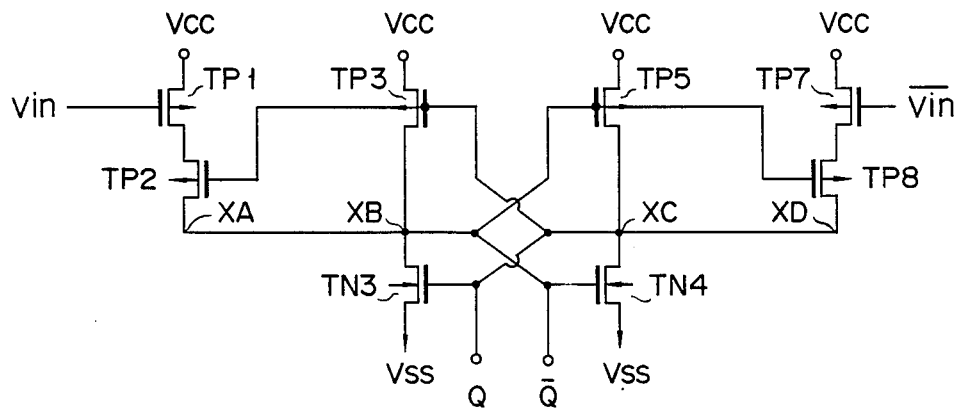

FIG. 6B shows an equivalent circuit of the circuit of FIG. 4 when clock signal $\phi$ is in "L" level, that is, in a latched state.

Figure 7:
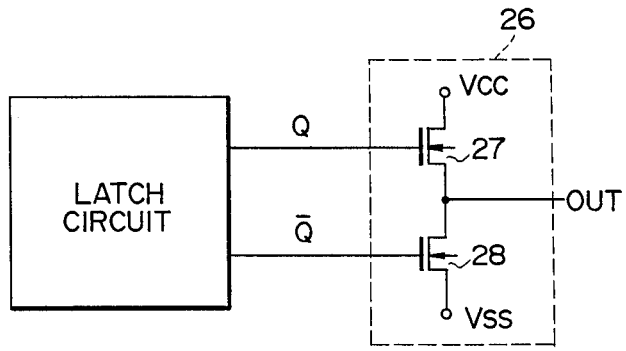
FIG. 7 shows a circuit arrangement when the latch circuit of FIG. 4 is followed by an output circuit.

As just mentioned, the latch circuit shown in FIG. 4 will never encounter such a situation that the outputs Q and $\overline{Q}$ are simultaneously in "H" level. This implies that when a data output latch circuit is formed by connecting output circuit 26 as shown in FIG. 7 to the output of the latch circuit of FIG. 4, there never occurs such a situation that load transistor 27 and drive transistor 28 are simultaneously turned on. Therefore, no rush-current flows between the power source terminals, securing the power saving.

In the DRAMs frequently used for image memories, the data read out from the memory cell is transferred through a pair of data lines to the output circuit 26 as shown in FIG. 7. The latch circuit shown in FIG. 4 is very suitable for the data output latch circuit for the DRAM.

While the conventional latch circuit is controlled by clock signals $\phi$ and $\overline{\phi}$ of two phases, the latch circuit of FIG. 4 may easily be controlled by the single-phase clock signal $\phi$, and two output signals Q and $\overline{Q}$ may be obtained with a simple circuit construction. Therefore, when the memory device including the latch circuit is fabricated into an integrated circuit, a pattern area of the semiconductor chip may be remarkably reduced.

Thus, the latch circuit of this invention has many advantages. For example, the output voltage is more stable. The circuit is almost free from the malfunction operation due to the high impedance problem which is essential to the conventional clocked inverter. Even in a high speed operation of the related device, the low power dissipation is ensured.

Figure 8:
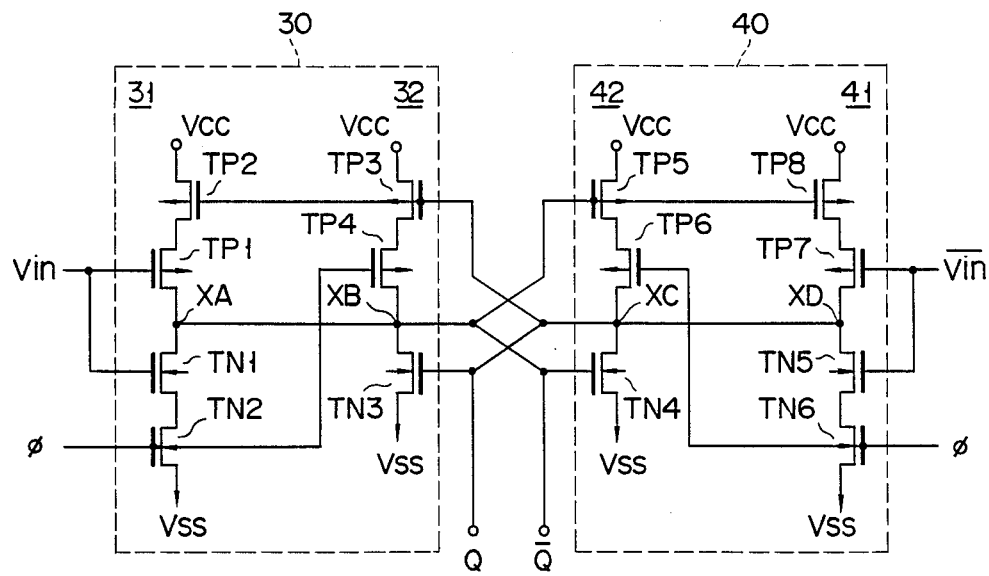
FIGS. 8 through 11 show respectively the circuit diagrams of modifications of the latch circuit shown in FIG. 4.

FIGS. 8 to 11 show modifications of the latch circuit shown in FIG. 4. In these circuits, like reference symbols are used for designating like or equivalent portions in FIG. 4. When comparing with the circuit arrangement of FIG. 4, MOS transistors TP1 and TP2 in FIG. 8 are interchanged with each other. The same thing is true for those pairs of MOS transistors TN2 and TN1, TP7 and TP8, and TN6 and TN5. To be more specific, the first end of transistor TP2 is connected to the power source Vcc terminal. The gate of transistor TP2 is connected to node XC. The first end of transistor TP1 is connected to the second end of transistor TP2. The second end of transistor TP1 is connected to node XA. The gate of transistor TP1 is coupled for reception with input signal Vin. The first end of transistor TN2 is coupled with the power source Vss terminal, and its gate is coupled for reception with clock signal $\phi$. The first end of transistor TN1 is connected to the second end of transistor TN2, and its second end is connected to node XA. The gate of transistor TN1 is supplied with input signal Vin. The first end of transistor TP8 is connected to the power source Vcc terminal. The gate of transistor TP8 is connected to node XB. The first end of transistor TP7 is connected to the second end of transistor TP8, and its second end is connected to node XD. The gate of transistor TP7 is applied with input signal $\overline{Vin}$. The first end of transistor TN6 is connected to the power source Vss terminal and its gate is supplied with clock signal $\phi$. A first end of transistor TN5 is connected to the second end of transistor TN6, and its second end is connected to node XD. The gate of transistor TN5 is supplied with input signal $\overline{Vin}$.

The latch circuit thus arranged operates in a manner similar to that of the FIG. 4 circuit, and may have substantially the same effects as those of the FIG. 4 circuit.

In the FIG. 4 circuit, each pair of the paired transistors whose current paths are connected in series, may be interchanged. Those paired transistors are transistors TP1 and TP2, TP3 and TP4, TP5 and TP6, TP7 and TP8, TN2 and TN1, and TN6 and TN5. The interchange of the paired transistors may be applied for one or more pairs of transistors. If necessary, the transistors may be interchanged in all the pairs of the transistors, as shown in FIG. 9.

Figure 10:
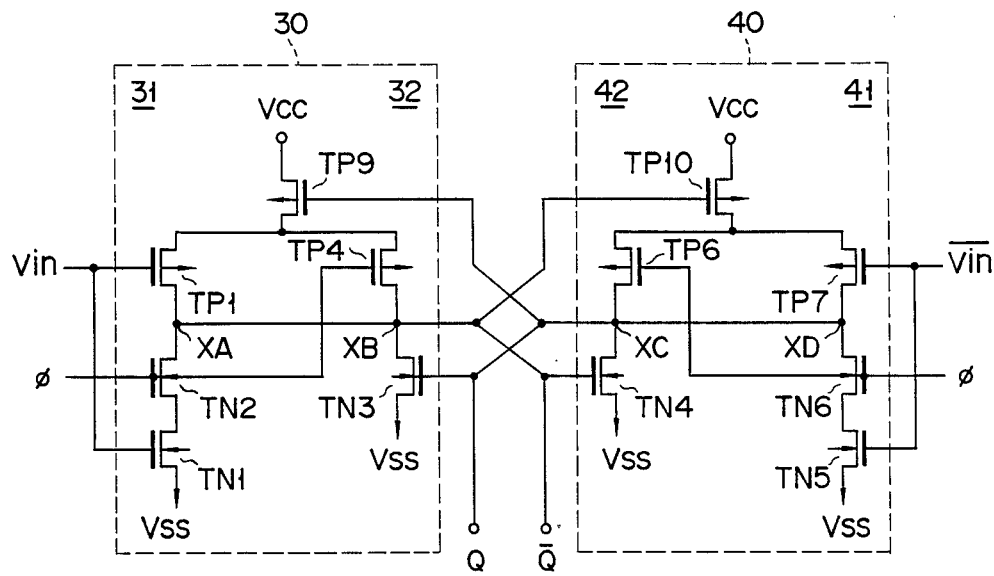

In the FIG. 10 circuit, the paired transistors TP1 and TP2, and TP7 and TP8 in FIG. 4 are interchanged with each other. The transistors TP2 and TP3 whose gates are connected to node XC are replaced by one transistor TP9. One transistor TP10 is used in place of the two transistors TP5 and TP8 connected at the gates to node XB.

Figure 9:
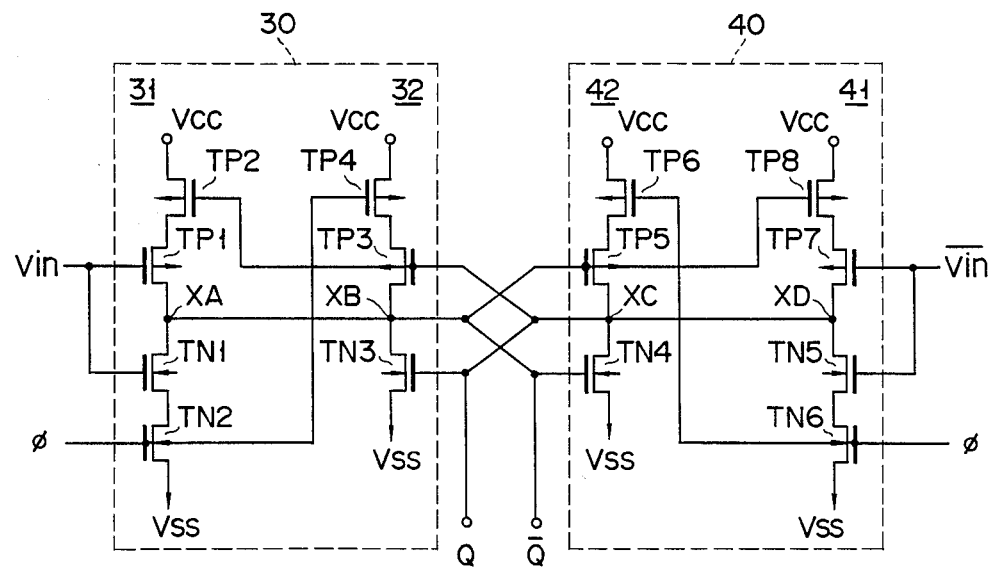

The latch circuit thus arranged operates in a manner similar to that of the FIGS. 4, 8 or 9 circuit, and may have substantially the same effects as those of the FIG. 4 circuit. Additionally, the FIG. 10 latch circuit replaces two pairs of transistors by only two transistors. In this respect, the circuit is simplified. This is advantageous when it is fabricated by the IC technology. That is, the FIG. 10 circuit may be IC fabricated with a higher package density than the FIGS. 4, 8 and 9.

Figure 11:
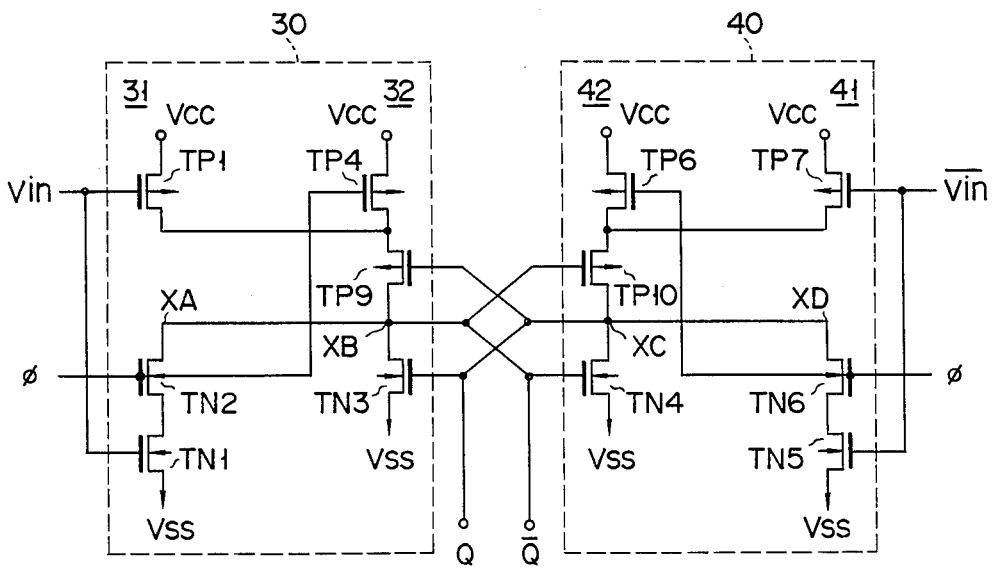

In the latch circuit shown in FIG. 11, a plurality of transistors are replaced by a single transistor, reducing the number of circuit elements. Specifically, the transistor interchange is applied for the pair of transistors TP3 and TP4, and TP5 and TP6. A single transistor TP9 is used in place of the transistors TP2 and TP3 whose gates are connected to node XC. A single transistor TP10 substitutes the two transistors TP5 and TP8 whose gates are connected to node XB. In other words, the transistor TP9 in the FIG. 10 circuit is interchanged with transistors TP1 and TP4. The transistor TP10 is interchanged with transistors TP6 and TP7.

The latch circuit thus arranged operates in a manner similar to that of the FIG. 10 circuit, and may have substantially the same effects as those of the circuit.

Figure 12:
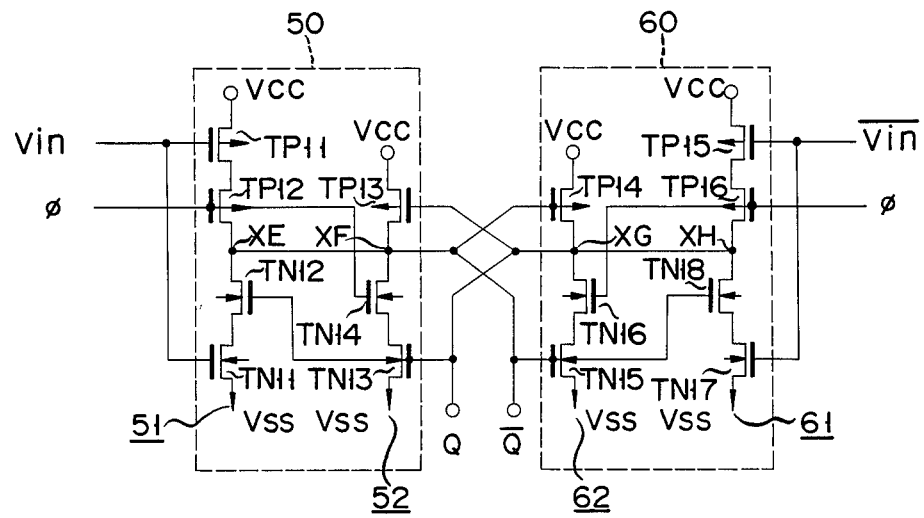
FIG. 12 shows a circuit diagram of a latch circuit according to a second embodiment of this invention.

FIG. 12 shows a second embodiment of a latch circuit according to this invention. The present latch circuit is arranged so that paired input signals Vin and $\overline{Vin}$ are fetched when clock signal $\phi$ is "L", and these are latched when it is "H".

As shown, the latch circuit is comprised of first circuit 50 and second circuit 60. The first circuit 50 includes clocked inverter 51, and a modified type of clocked inverter 52. The modified clocked inverter 52 is made up of a single P channel MOS transistor and two N channel MOS transistors. Clock signal $\phi$ is applied to P channel MOS transistor TP12 as a switching transistor in clocked inverter 51, and the gates of N channel MOS transistor TN14 as a switching transistor in clocked inverter 52. The output node of the second circuit 60 is coupled with the gates of P channel MOS transistor TP13 and N channel MOS transistor TN13 in the inverter 52, and the gate of N channel MOS transistor TN12 as a switching transistor in the inverter 51.

The circuit arrangement of second circuit 60 is substantially the same as that of first circuit 50. The gates of the transistors TP15 and TN17 in clocked inverter 61 are coupled for reception with input signal $\overline{Vin}$ as the inversion of the gate input signal Vin of the transistors TP11 and TN11 in first circuit 50. The output node of first circuit 50 is connected to the gates of transistors TP14 and TN15 in a modified type of clocked inverter 62, and the gate of switching N channel MOS transistor TN18 in clocked inverter 61.

Figure 13:
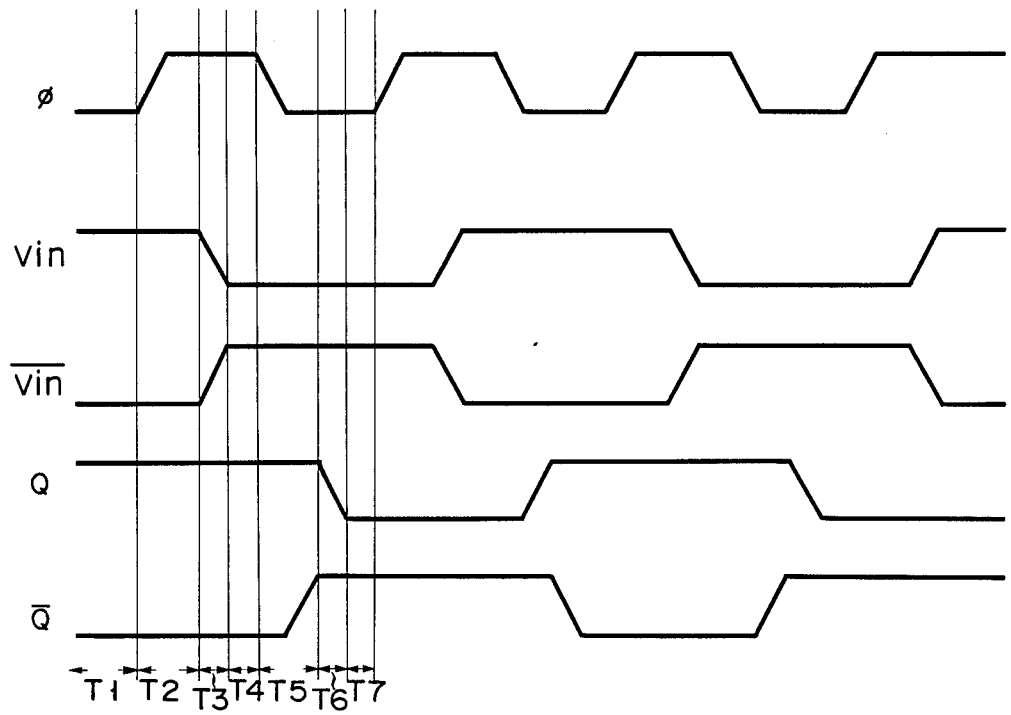
FIG. 13 shows a timing chart useful in explaining the operation of the latch circuit of FIG. 12.

The operation of the latch circuit shown in FIG. 12 will be described referring to a timing chart of FIG. 13.

In a first period (T1), clock signal $\phi$ is "L", and input signal Vin is "H". Under this condition, MOS transistors TP12, TP14, TP15, TP16, TN11, TN12 and TN13 are in an on state. MOS transistors TP11, TP13, TN14, TN15, TN16, TN17 and TN18 are in an off state. At this time, output Q is in "H" level, and output $\overline{Q}$ is in "L" level.

In a second period (T2), clock signal $\phi$ is changed from "L" to "H" and input signal Vin maintains the logical state of "H". MOS transistors TP12 and TP16 are turned off, and transistors TN14 and TN16 are turned on. As a result, clocked inverter 51 stops its operation, while modified type clocked inverters 52 and 62 start to operate and to execute the flip-flop operation, so that the output signals Q and $\overline{Q}$ are latched therein.

In a third period (T3), clock signal $\phi$ is "H", and input signal Vin changed from "H" to "L". MOS transistors TP11 and TN17 are turned on, and transistors TN11 and TP15 are turned off. Since at this time the circuit is in a latched state, however, the circuit rejects the reception of input signals Vin and $\overline{Vin}$, and maintains the logical states at outputs Q and $\overline{Q}$.

In a fourth period (T4), clock signal is "H", and input signal Vin is "L". Under this condition, the circuit is in a latched state, and maintains the logical states of output signals Q and $\overline{Q}$.

In a fifth period (T5), clock signal $\phi$ is changed from "H" to "L", and input signal Vin is "L". Under this condition, MOS transistors TP12 and TP16 are turned on, and transistors TN14 and TN16 are turned off. In turn, the potential at output $\overline{Q}$ of first circuit 50 starts to increase.

In a sixth period (T6), clock signal $\phi$ and input signal Vin are "L". The output $\overline{Q}$ is "H", and MOS transistor TP14 is turned off, and transistors TN15 and TN18 are turned on. Transistors TN17 and TN18 are turned on, and the potential at the output Q of second circuit 60 starts to drop.

In a seventh period (T7), clock signal $\phi$ is "L", and input signal Vin is also "L". The output Q is "L" in logical state, and transistors TN12 and TN13 are turned off, and transistor TP13 is turned on. At this point, the inversion of the logical states at circuit outputs Q and $\overline{Q}$ has been completed.

Subsequently, a sequence of the operations from period T1 to period T7 is repeated.

Figure 14A:
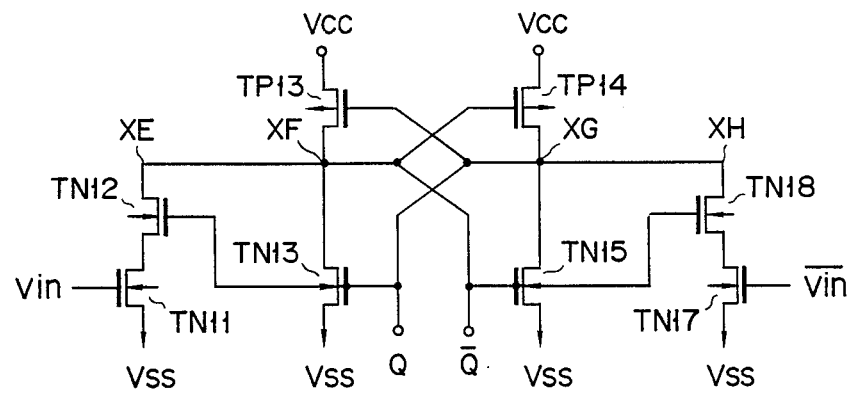
FIGS. 14A and 14B show respectively equivalent circuits of the latch circuit of FIG. 12 when it receives a clock signal in the different logical states.
Figure 14B:
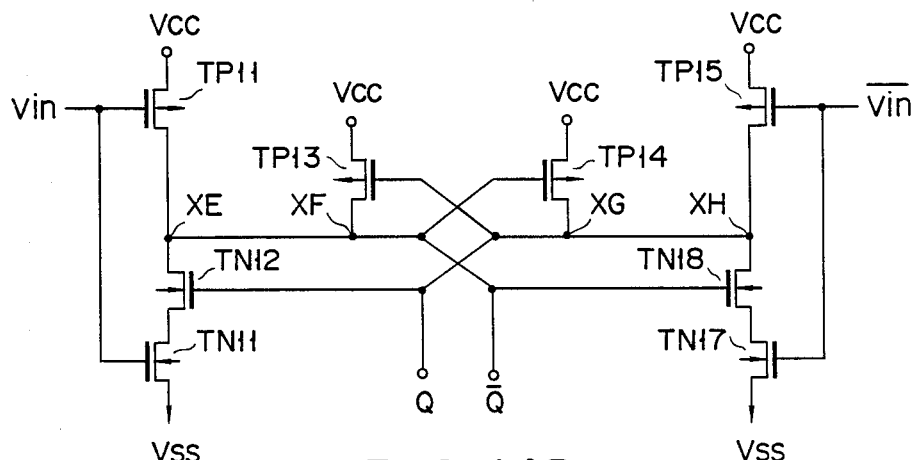

FIG. 14B shows an equivalent circuit of the FIG. 8 circuit when clock signal $\phi$ is in an "L" level, that is, the output is in the inverted based on input signals. Conductive lines indicate the transistors which are normally in an on-state when clock signal $\phi$ is "L". The normally-off transistors and the transistors disconnected from the circuit when the circuit is operating, are omitted in the illustration. As seen from the figure, either of the transistors TP11 and TP15, when the gate of it is in "L" level, is turned on. In turn, the voltage at the drain of the turned-on transistor rises. Then, the flip-flop starts to operate. The logical state of the other output signal is inverted. This fact indicates that this circuit allows both the outputs to simultaneously be in an "H" level, but it prohibits them to simultaneously be in an "L" level. FIG. 14A shows an equivalent circuit of the FIG. 8 circuit, when the clock signal $\phi$ is in an "H" level, that is, the circuit is in a latched state.

Figure 15:
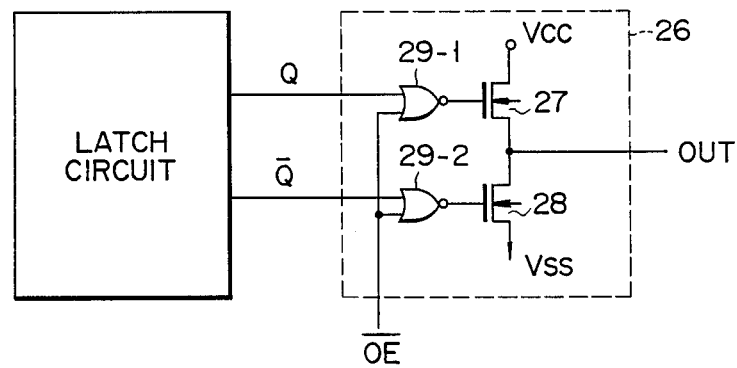
FIG. 15 shows a circuit arrangement when the latch circuit of FIG. 12 is followed by an output circuit.

As described above, in the latch circuit of FIG. 12, after output Q goes "H", output $\overline{Q}$ goes "L", and after output $\overline{Q}$ goes "H", output Q goes "L". Therefore, the outputs Q and $\overline{Q}$ may be simultaneously in an "H" level, but there never occurs a situation that both outputs are simultaneously in an "L" level. When considering a data output latch circuit the output circuit 26 using NOR gates 29-1 and 29-2 as shown in FIG. 15 is connected to the post stage of the circuit of FIG. 12. There will never occur such a situation that load transistor 27 and drive transistor 28 are simultaneously in an on state. Therefore, the rush-current can be prevented, resulting in power saving.

An output circuit of the memory is so arranged that it outputs a signal under control of output enable signal $\overline{OE}$, as shown in FIG. 15. When output enable signal $\overline{OE}$ is "L", the output signal Q of the latch circuit is applied to load transistor 27, and the output signal $\overline{Q}$ is supplied to drive transistor 28. When signal $\overline{OE}$ is "H", the supply of the outputs Q and $\overline{Q}$ to transistors 27 and 28 are shut off. When signal $\overline{OE}$ is "L", if the outputs Q and $\overline{Q}$ are simultaneously "L", the outputs of NOR gates 29-1 and 29-2 are simultaneously "H", so that transistors 27 and 28 are simultaneously in an on state. Therefore, at this time, the rush-current flows between the power source terminals.

In this respect, the latch circuit of FIG. 12 in which the output signals are prohibited from going simultaneously "L", is very suitable for the data output latch circuit of the memory device.

FIGS. 16 to 19 show modifications of the latch circuit shown in FIG. 12. In these circuits, like reference symbols are used for designating like or equivalent portions in FIG. 12. When comparing with the circuit arrangement of FIG. 12, MOS transistors TP11 and TP12 are interchanged with each other in FIG. 16. The same thing is true for those pairs of MOS transistors TN12 and TN11, TP15 and TP16, and TN18 and TN17. To be more specific, the first end of transistor TP12 is connected to the power source Vcc terminal. The gate of transistor TP12 is connected for reception with clock signal. The first end of transistor TP11 is connected to the second end of transistor TP12. The second end of transistor TP11 is connected to node XE. The gate of transistor TP11 is coupled for reception with input signal Vin. The first end of transistor TN12 is coupled with the power source Vss terminal, and its gate is coupled with node XG. The first end of transistor TN11 is connected to the second end of transistor TN12, and its second end is connected to node XE. The gate of transistor TN11 is coupled for reception with input signal Vin. A first end of transistor TP16 is connected to the power source Vcc terminal, and its gate is applied with clock signal $\phi$. The first end of transistor TP15 is connected to the second end of transistor TP16, and its second end is connected to node XH. The gate of transistor TP15 is applied with input signal $\overline{Vin}$. The first end of transistor TN18 is coupled with the power source Vss terminal, and its gate is coupled with node XF. The first end of transistor TN17 is connected to the second end of transistor TN18, and its second end is connected to node XH. The gate of transistor TN17 is supplied with input signal $\overline{Vin}$.

The latch circuit thus arranged operates in a manner similar to that of the FIG. 12 circuit, and may have substantially the same effects as those of the FIG. 12 circuit.

In the FIG. 12 circuit, each pair of the paired transistors whose current paths are connected in series, may be interchanged. Those paired transistors are transistors TP11 and TP12, TP15 and TP16, TN12 and TN11, TN14 and TN13, TN16 and TN15, and TN18 and TN17. The interchange of the paired transistors may be applied for one or more pairs of transistors. If necessary, the transistors may be interchanged in all the pairs of the transistors, as shown in FIG. 17.

Figure 18:
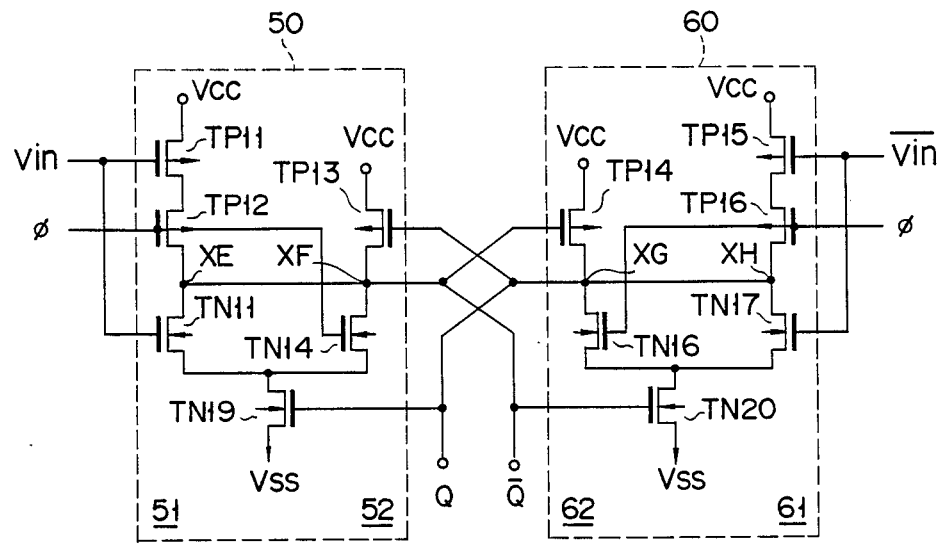

In the FIG. 18 circuit, the paired transistors TN12 and TN11, and TN18 and TN17 in FIG. 12 are interchanged with each other. The transistors TN12 and TN13 whose gates are connected to node XG are replaced by one transistor TN19. One transistor TN20 is used in place of the two transistors TN15 and TN18 connected at the gates to node XF.

Figure 16:
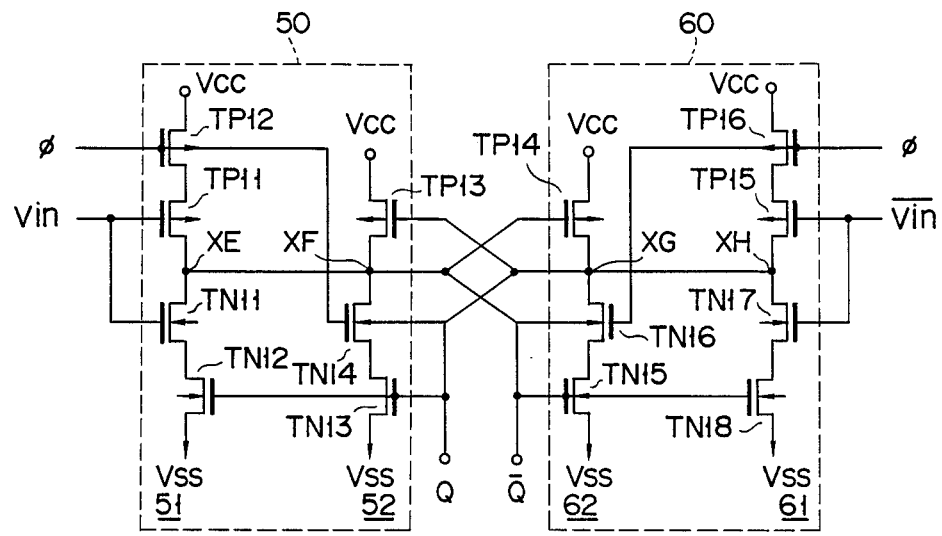
FIGS. 16 through 19 respectively the circuit diagrams of modifications of the latch circuit shown in FIG. 12.
Figure 17:
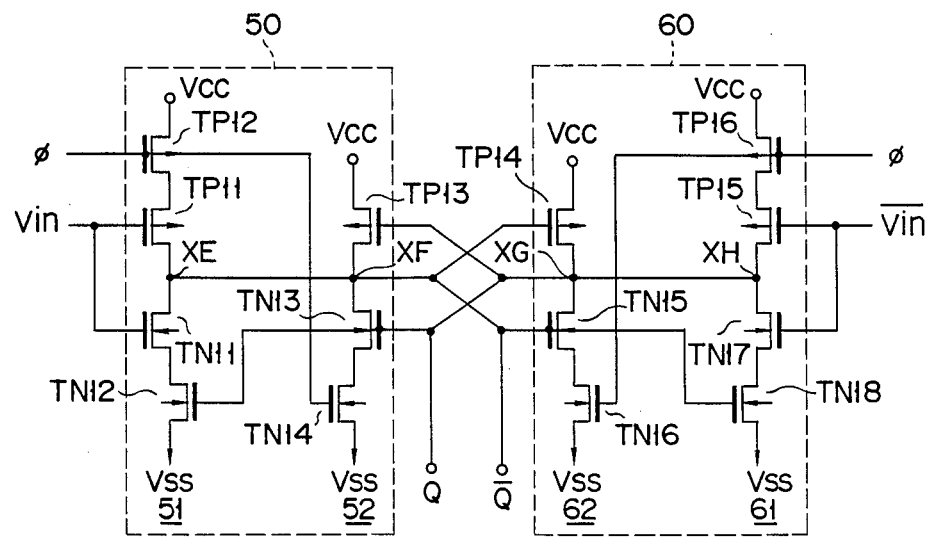

The latch circuit thus arranged operates in a manner similar to that of the FIGS. 12, 16 or 17 circuit, and may have substantially the same effects as those of the circuit. Additionally, the FIG. 18 latch circuit replaces two pairs of transistors by only two transistors. In this respect, the circuit is simplified. This is advantageous when it is fabricated by the IC technology. That is, the FIG. 18 circuit may be IC fabricated with a higher package density than the FIGS. 12, 16 and 17.

Figure 19:
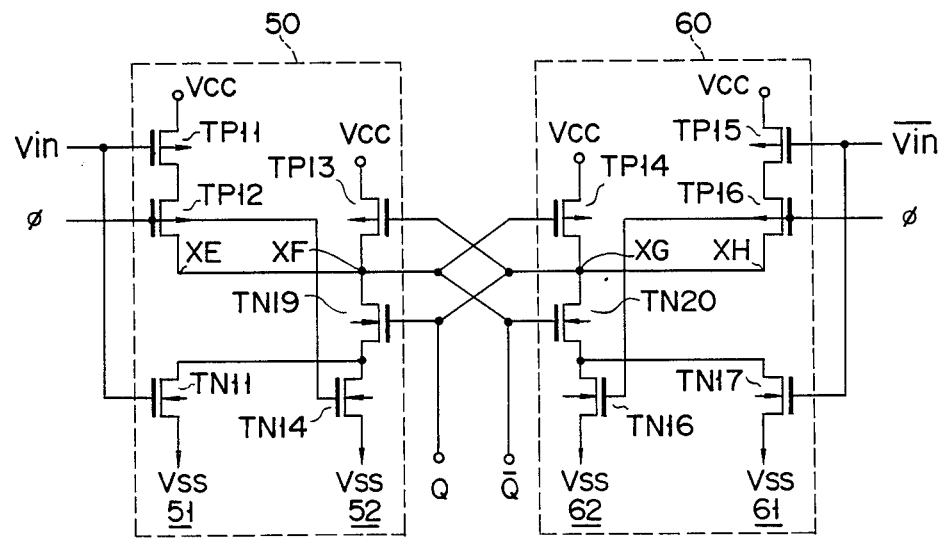

In the latch circuit shown in FIG. 19, a plurality of transistors are replaced by a single transistor, reducing the number of circuit elements. Specifically, the transistor interchange is applied for the paris of transistors TN14 and TN13, and TN16 and TN15. A single transistor TN19 is used in place of the transistors TN12 and TN13 whose gates are connected to node XG. A single transistor TN20 substitutes the two transistors TN15 and TN18 whose gates are connected to node XF. In other words, the transistor TN19 in the FIG. 18 circuit is interchanged with transistors TN11 and TN14. The transistor TN20 is interchanged with transistors TN16 and TN17.

The latch circuit thus arranged operates in a manner similar to that of the FIG. 18 circuit, and may have substantially the same effects as those of the circuit.

Figure 20:
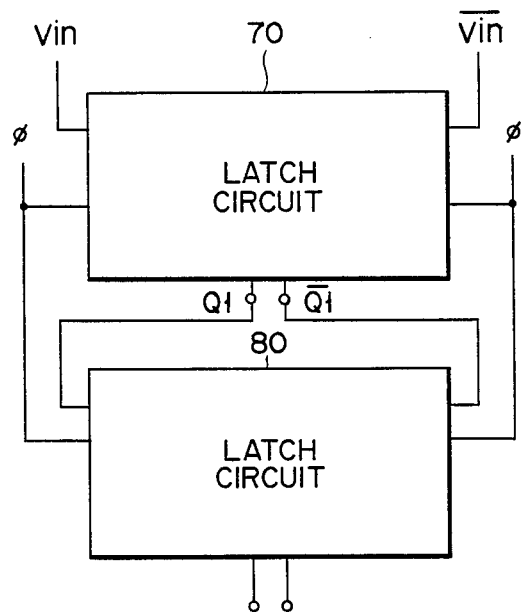
FIG. 20 shows a block diagram showing a shift register according to a third embodiment of this invention.

Turning now to FIG. 20, there is in block form shown a one-bit shift register. The shift register is formed by cascade connecting any one of the latch circuits of FIG. 4 and FIGS. 8 to 11, and any one of the latch circuits of FIG. 12, and FIGS. 16 to 19.

The shift register is comprised of first latch circuit 70 and second latch circuit 80. One of the latch circuits of FIG. 4, and FIGS. 8 to 11 is used for the first latch circuit 70. The latch circuit 70 is supplied with input signals Vin and $\overline{Vin}$, and clock signal $\phi$. The output signal of first latch circuit 70 is applied to second latch circuit 80. Any one of the latch circuits shown in FIG. 12, and FIGS. 16 to 19 is used for the second latch circuit 80. The second latch circuit 80 is supplied with clock signal $\phi$.

If necessary, a n-bit (n=an integer more than one) may be formed by connecting "n" stages of shift register of FIG. 20 in a cascade fashion.

Figure 21:
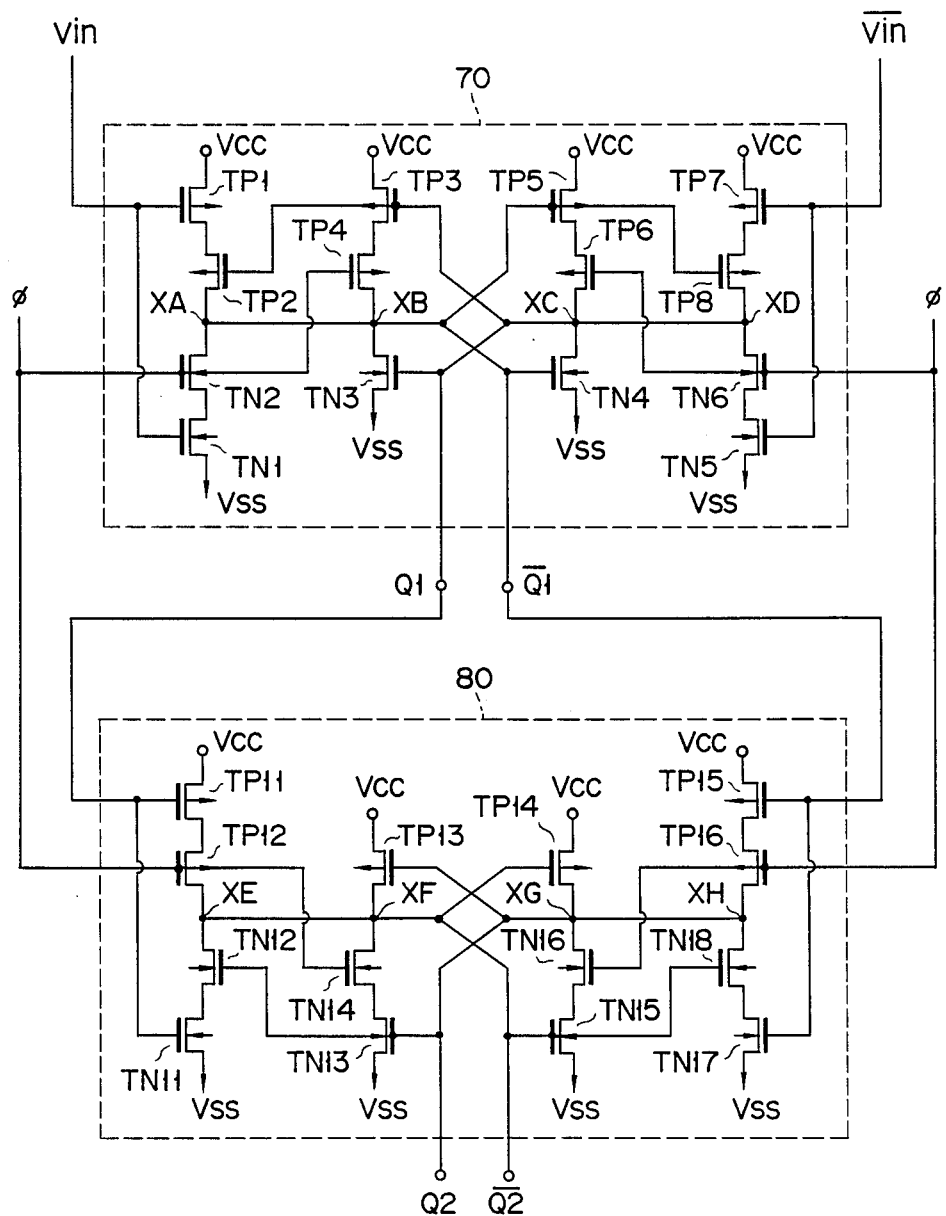
FIG. 21 shows a circuit diagram of a shift register arranged by combining the latch circuits of FIGS. 4 and 12.

FIG. 21 shows a circuit diagram of the one-bit shift register shown in FIG. 20. In the shift register, the FIGS. 4 and 12 latch circuits respectively denoted as 70 and 80 are connected in a cascade fashion.

In operation, when clock signal $\phi$ is changed from "L" to "H" in logical level, input signals Vin and $\overline{Vin}$ are applied to the latch circuit 70 as a master section of the shift register. Then, the master section outputs signals Q1 and $\overline{Q1}$. At this time, latch circuit 80 latches the data of Q1 and $\overline{Q1}$ as obtained when clock signal $\phi$ is "L".

When clock signal $\phi$ changes its logical state from "H" to "L", the latch circuit 80 fetches the outputs Q1 and $\overline{Q1}$ of the circuit 70, and outputs signals Q2 and $\overline{Q2}$. At this time, latch circuit 70 latches the data Vin and $\overline{Vin}$ as obtained when clock signal $\phi$ is "H".

Figure 22:
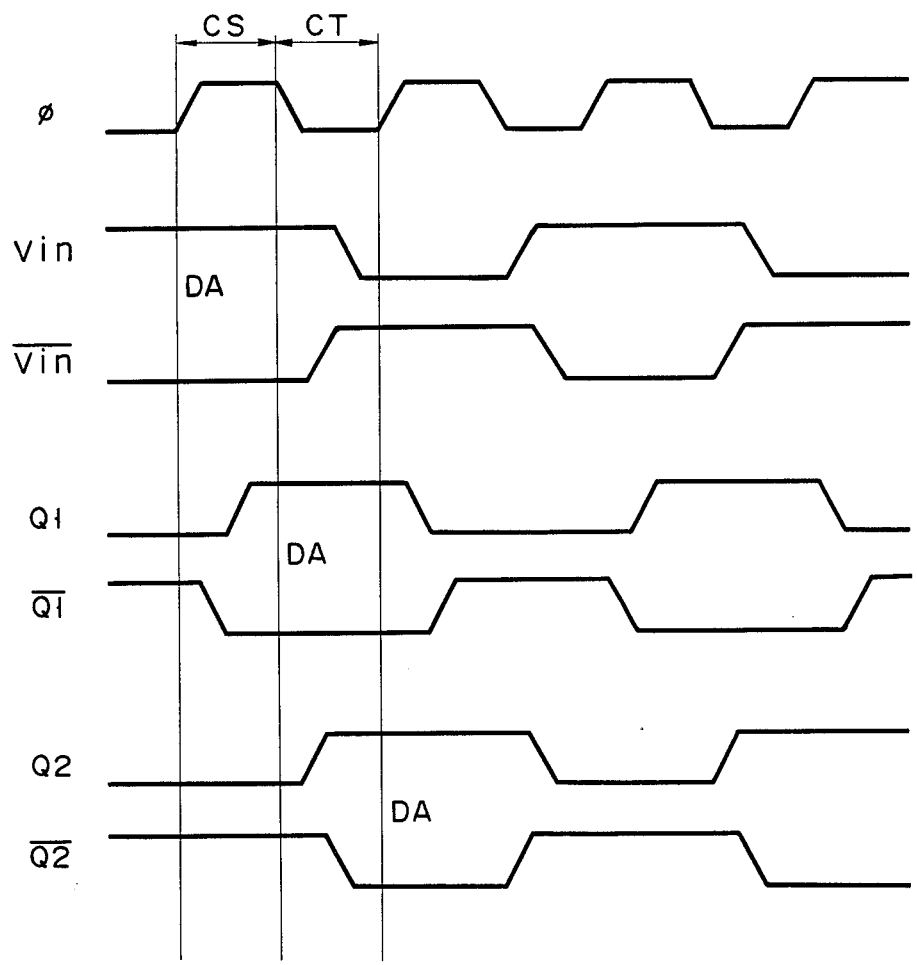
FIG. 22 shows a timing chart useful in explaining the operation of the shift register shown in FIG. 21.

As shown in FIG. 22, the data in the phase denoted as DA (input signal Vin is "H", and input signal $\overline{Vin}$ is "L") is transferred in the form of output signals Q1 and $\overline{Q1}$ to the output terminal of the latch circuit 70 during the half cycle CS of clock signal $\phi$. In the next half cycle CT, the data DA is transferred in the form of output signals Q2 and $\overline{Q2}$ to the output terminal of latch circuit 80. In this way, during one cycle of clock signal $\phi$, the one-bit shift register completes the data transfer.

Thus, in the FIG. 21 shift register, the data transfer may be controlled by single-phase clock signal $\phi$. When comparing with the conventional shift register using the clock signals of two phases, the pattern area for the clock generator may be considerably reduced. The FIG. 21 shift register is free from the malfunction operation due to the phase shift of the clock signals.

As a matter of course, the shift register may be constructed with the latch circuits of FIGS. 4, and 8 to 11, or those of FIGS. 12, and 16 to 19.

Figure 23:
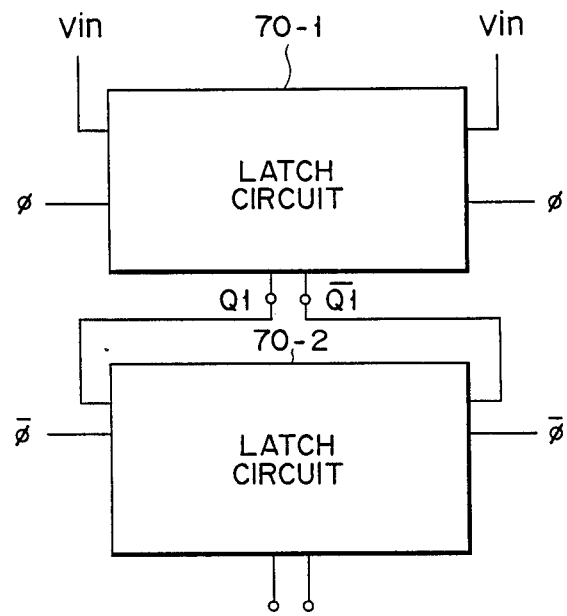
FIG. 23 shows a block diagram of a shift register according to a fourth embodiment of this invention.

FIG. 23 shows in block form a one-bit shift register constructed with two of the latch circuits of FIGS. 4, and 8 to 11, which are connected in a cascade fashion. Any one of the latch circuits of FIGS. 4, and 8 to 11 is used for first latch circuit 70-1. This latch circuit 70-1 is supplied with input signals Vin and $\overline{Vin}$, and clock signal $\phi$. The output signals Q1 and $\overline{Q1}$ of latch circuit 70-1 are applied to second latch circuit 70-2. The second latch 70-2 is constructed with any one of the latch circuits of FIGS. 4, and 8 to 11, like the first latch circuit 70-1. The second latch circuit 70-2 is applied with clock signal $\overline{\phi}$ as the inversion of clock signal $\phi$.

Figure 24:
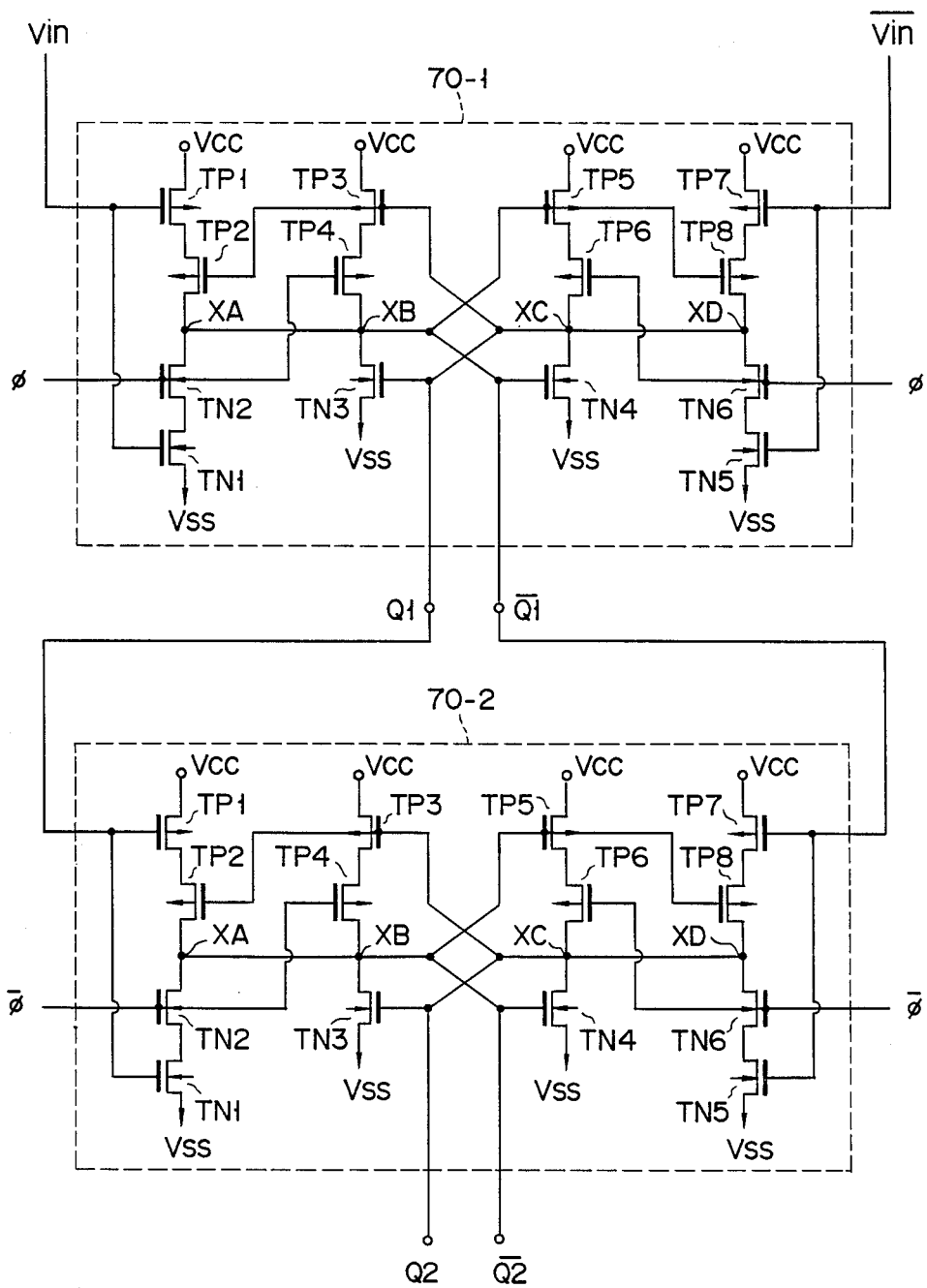
FIG. 24 shows a circuit diagram of a shift register arranged by connecting the latch circuits of FIG. 4 in a cascade fashion.

For forming a shift register of "n" bits, a FIG. 24 circuits of "n" are connected in a cascade fashion.

FIG. 24 show the details of the FIG. 23 circuit. As shown, this circuit consists of the two circuits of FIG. 4 are cascaded connected. Latch circuit 70-1 is supplied with input signals Vin and $\overline{Vin}$, and clock signal $\phi$. The output signals Q1 and $\overline{Q1}$ of latch circuit 70-1, and clock signal $\overline{\phi}$ are applied to latch circuit 70-2.

In operation, when clock signal $\phi$ changs its logical state from "L" to "H", input signals Vin and $\overline{Vin}$ are applied to the circuit 70-1 as a master section of the shift register. The master section provides output signals Q1 and $\overline{Q1}$. At this time, the latch circuit 70-2 latches the data of Q1 and $\overline{Q1}$ as obtained when clock signal $\overline{\phi}$ is "H".

When clock signal $\phi$ changes its logical state from "H" to "L", the latch circuit 70-2 fetches the outputs Q1 and $\overline{Q1}$ of the circuit 70-1, and outputs signals Q2 and $\overline{Q2}$. At this time, latch circuit 70-1 latches the data Vin and $\overline{Vin}$ as obtained when clock signal $\phi$ is "H".

The data in the phase is transferred to the output terminal of the latch circuit 70-1 during the half cycle of clock signals $\phi$ and $\overline{\phi}$. In the next half cycle, the data is transferred to the output terminal of latch circuit 70-2. In this way, during one cycle of clock signals $\bar{\phi}$ and the one-bit shift register completes the data transfer.

In the circuits of FIGS. 23 and 24, the clock signals applied to the master and slave sections must have a predetermined phase difference, that is, these signals must be opposite phase. It is noted here that since the latch circuits 70-1 and 70-2 is free from the high impedance problem, and hence the output potentials of them are stable, the shift register constructed with these latch circuits operate more stably than the conventional shift register.

FIG. 25 shows in block form a one-bit shift register constructed with two of the latch circuits of FIGS. 12, and 16 to 19 which are connected in a cascade fashion. Any one of the latch circuits of FIGS. 12, and 16 to 19 is used for first latch circuit 80-1. This latch circuit 80-1 is supplied with input signals Vin and $\overline{\text{Vin}}$, and clock signal $\phi$. The output signals Q1 and $\overline{\text{Q1}}$ of latch circuit 80-1 are applied to second latch circuit 80-2. The second latch 80-2 is constructed with any one of the latch circuits of FIGS. 12, and 16 to 19, like the first latch circuit 80-1. The second latch circuit 80-2 is applied with clock signal $\bar{\phi}$.

For forming a shift register of "n" bits, a FIG. 25 circuits of "n" are connected in a cascade fashion.

Figure 26:
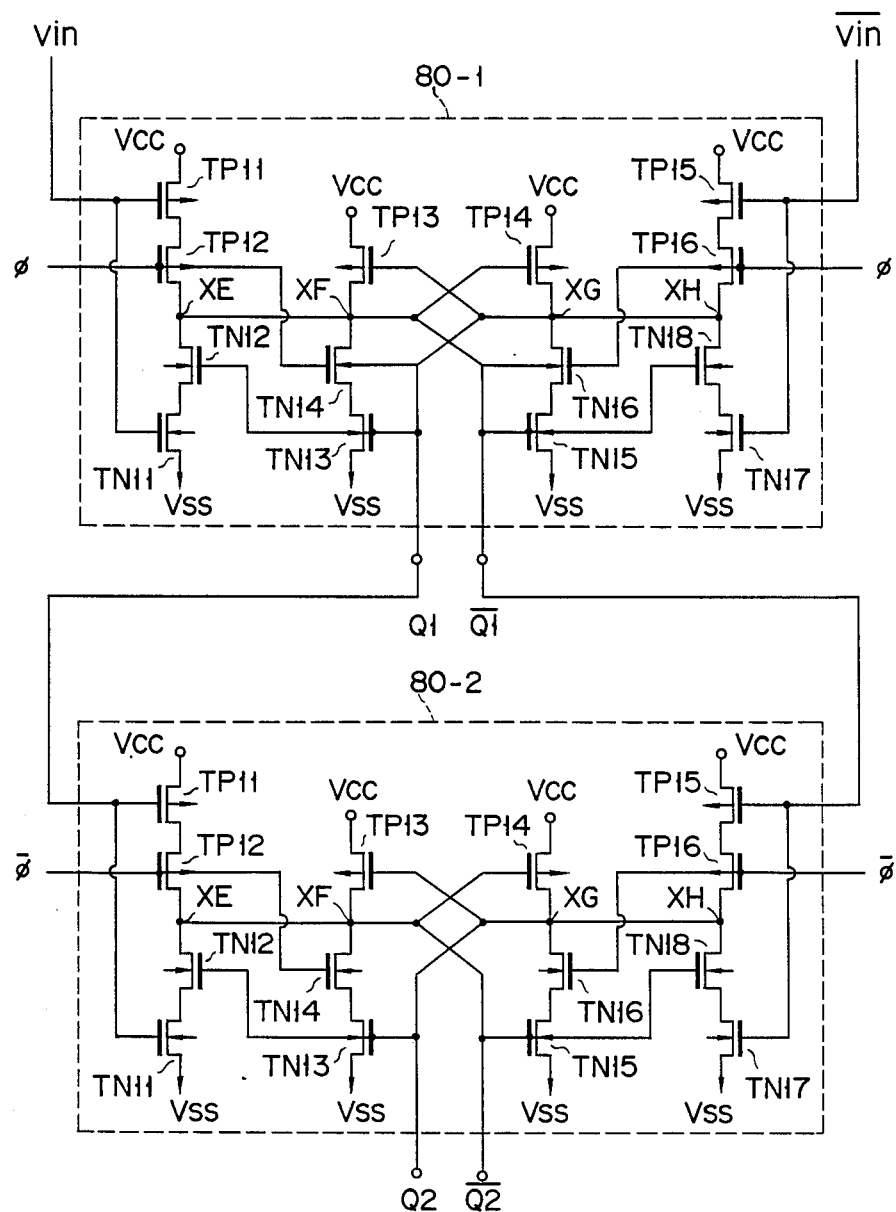
FIG. 26 shows a circuit diagram of a shift register arranged by cascade connecting the circuits of FIG. 12.

FIG. 26 show the details of the FIG. 25 circuit. As shown, this circuit consists of the two circuits of FIG. 12 are cascaded connected. Latch circuit 80-1 is supplied with input signals Vin and $\overline{\text{Vin}}$, and clock signal $\phi$. The output signals Q1 and $\overline{\text{Q1}}$ of latch circuit 80-1, and clock signal $\bar{\phi}$ are applied to latch circuit 80-2.

In operation, when clock signal $\phi$ changs its logical state from "H" to "L", input signals Vin and $\overline{\text{Vin}}$ are applied to the circuit 80-1 as a mastersection of the shift register. The master section outputs signals Q1 and $\overline{\text{Q1}}$. At this time, the latch circuit 80-2 latches the data of Q1 and $\overline{\text{Q1}}$ as obtained when clock signal $\bar{\phi}$ is "L".

When clock signal $\phi$ changes its logical state from "L" to "H", the latch circuit 80-2 fetches the outputs Q1 and $\overline{\text{Q1}}$ of the circuit 80-1, and outputs signals Q2 and $\overline{\text{Q2}}$. At this time, latch circuit 80-1 latches the data Vin and $\overline{\text{Vin}}$ as obtained when clock signal $\phi$ is "L".

Thus, the data of Vin and $\overline{\text{Vin}}$ are is transferred in the form of the output signal Q1 and $\overline{\text{Q1}}$ to the output terminal of the latch circuit 80-1 during the half cycle of clock signals $\phi$ and $\bar{\phi}$. In the next half cycle, the data is transferred to the output terminal of latch circuit 80-2. In this way, during one cycle of clock signals $\phi$ and $\bar{\phi}$, the one-bit shift register completes the data transfer.

In the circuits of FIGS. 23 and 24, the clock signals applied to the master and slave sections must have a predetermined phase difference, that is, these signals must be opposite phase. It is noted here that since the latch circuits 80-1 and 80-2 is free from the high impedance problem, and hence the output potentials of them are stable, the shift register constructed with these latch circuits operate more stably than the conventional shift register.

As described above, a high impedance state at the output terminal of the clocked inverter is prevented. The circuit may be controlled by a single-phase clock signal. Further, the complementary output signals are never in the same logical state of "H" or "L". Therefore, according to this invention, there are provided the two types of latch circuits. which are stable in a high speed operation, and with a less amount of power dissipation. When these circuits are connected in a cascade fashion, a shift register controllable by a single-phase clock signal may be obtained.

What is claimed is:
1. A latch circuit comprising:
a first power source;
a first node;
a first signal output terminal for outputting a first output signal;
first and second transistors of a first conductivity type having current paths which are connected in series between said first power source and said first node, a gate of said first transistor connected for receiving a first input signal, and a gate of said second transistor connected to said first signal output terminal;
a second power source;
third and fourth transistors of a second conductivity type having current paths which are connected in series between said first node and said second power source, a gate of said third transistor connected for receiving a control signal, and a gate of said fourth transistor connected for receiving said first input signal;
a second node connected to said first node;
fifth and sixth transistors of the first conductivity type having current paths which are connected in series between said first power source and said second node, a gate of said fifth transistor connected with said first signal output terminal, and a gate of said sixth transistor connected for receiving said control signal;
a seventh transistor of the second conductivity type connected between said second node and said second power source, a gate of said seventh transistor connected to said first signal output terminal;
a third node connected to said first signal output terminal;
a second signal output terminal connected to said second node, for outputting a second output signal;
eighth and ninth tranistors of the first conductivity type having current paths which are connected in series between said first power source and said third node, a gate of said eighth transistor connected with said second signal output terminal, and a gate of said ninth transistor connected for receiving said control signal;
a tenth transistor of the second conductivity type connected between said third node and said second power source, a gate of said tenth transistor connected to said second signal output terminal;
a fourth node connected to said third node;
eleventh and twelfth transistors of the first conductivity type having current paths which are connected in series between said first power source and said fourth node, a gate of said eleventh transistor connected for receiving a second input signal as the inversion of said first input signal, and a gate of said twelfth transistor connected with said second signal output terminal; and
thirteenth and fourteenth transistors of the second conductivity type having current paths which are connected in series between said fourth node and said second power source, a gate of said thirteenth transistor connected for receiving said control signal, and a gate of said fourteenth transistor connected for receiving said second input signal.

2. The latch circuit according to claim 1, wherein said first power source is at a high potential, said second power source is at a ground potential, said first conductivity type transistors are P channel MOS transistors, and said second conductivity type transistors are N channel MOS transistors.

3. The latch circuit according to claim 2, further comprising a second latch circuit with substantially the same circuit arrangement as that of said latch circuit, both of said latch circuits constituting a shift register, said shift register being so arranged that the first and second output signals of said latch circuit are applied to said second latch circuit, and said first and second input signals are shifted in response to said control signal and an opposite phase signal of said control signal.

4. The latch circuit according to claim 2, further comprising an output circuit connected to said first and second signal output terminals.

5. The latch circuit according to claim 4, wherein said output circuit includes a first MOS transistor connected at a first end to said first power source, and at a gate to said first signal output terminal, and a second MOS transistor connected at a first end to a second end of said first MOS transistor, at a second end to said second power source, and at a gate to said second signal output terminal.

6. The latch circuit according to claim 1, wherein said first power source is at a high potential, said second power source is at a ground potential, said first conductivity type transistors are P channel MOS transistors, and said second conductivity type transistors are N channel MOS transistors, said second and fifth transistors are replaced by a fifteenth MOS transistor, and said eighth transistor and said twelfth transistor are replaced by a sixteenth MOS transistor.

7. The latch circuit according to claim 1, wherein said first power source is at a ground potential, said second power source is at a high potential, said first conductivity type transistors are N channel MOS transistors, and said second conductivity type transistors are P channel MOS transistors.

8. The latch circuit according to claim 7, further comprising a second latch circuit with substantially the same circuit arrangement as that of said latch circuit, both of said latch circuits constituting a shift register, said shift register being so arranged that the first and second output signals of said latch circuit are applied to said second latch circuit, and said first and second input signals are shifted in response to said control signal and a opposite phase signal of said control signal.

9. The latch circuit according to claim 7, further comprising an output circuit connected to said first and second signal output terminals.

10. The latch circuit according to claim 9, wherein said output circuit includes a NOR gate connected at a first input terminal to said first signal output terminal, and at a second input terminal for receiving an output enable signal; a first MOS transistor connected at a first end to said first power source, and at a gate to an output terminal of said first NOR gate; a second NOR gate connected at a first input terminal to said second signal output terminal, and at a second input terminal for receiving said output enable signal; and a second MOS transistor connected on a first end to a second end of said first MOS transistor, on a second end to said second power source, and at a gate to an output terminal of said second NOR gate.

11. The latch circuit according to claim 1, wherein said first power source is at a ground potential, said second power source is at a high potential, said first conductivity type transistors are N channel MOS transistors, and said second conductivity type transistors are P channel MOS transistors, said second and fifth transistors are replaced by a fifteenth MOS transistor, and said eighth transistor and said twelfth transistor are replaced by a sixteenth MOS transistor.

12. A shift register comprising:
(a) a first latch circuit including:
a first power source;
a first node;
a first signal output terminal for outputting a first output signal;
first and second transistors of a first conductivity type having current paths which are connected in series between said first power source and said first node, a gate of said first transistor connected for receiving a first input signal, and a gate of said second transistor connected with said first signal output terminal;
a second power source;
third and fourth transistors of a second conductivity type having current paths which are connected in series between said first node and said second power source, a gate of said third transistor being connected for receiving a control signal, and a gate of said fourth transistor connected for receiving said first input signal;
a second node connected to said first node;
fifth and sixth transistors of the first conductivity type having current paths which are connected in series between said first power source and said second node, a gate of said fifth transistor connected with said first signal output terminal, and a gate of said sixth transistor connected for receiving said control signal;
a seventh transistor of the second conductivity type connected between said second node and said second power source, a gate of said seventh transistor connected to said first signal output terminal;
a third node connected to said first signal output terminal;
a second signal output terminal connected to said second node, for outputting a second output signal;
eighth and ninth transistors of the first conductivity type having current paths which are connected in series between said first power source and said third node, a gate of said eighth transistor connected with said second signal output terminal, and a gate of said ninth transistor connected for receiving said control signal;
a tenth transistor of the second conductivity type connected between said third node and said second power source, a gate of said tenth transistor connected to said second signal output terminal;
a fourth node connected to said third node;
eleventh and twelfth transistors of the first conductivity type having current paths which are connected in series between said first power source and said fourth node, a gate of said eleventh transistor connected for receiving a second input signal as the inversion of said first input signal, and a gate of said twelfth transistor connected with said second signal output terminal; and
thirteenth and fourteenth transistors of the second conductivity type having current paths which are connected in series between said fourth node and said second power source, a gate of said thirteenth transistor connected for receiving said control signal, and a gate of said fourteenth transistor connected for receiving said second input signal, and (b) a second latch circuit including;

a first power source;

a first node;

a first signal output terminal for outputting a first output signal;

first and second transistors of a first conductivity type having current paths which are connected in series between said first power source and said first node, a gate of said first transistor connected for receiving a first input signal, and a gate of said second transistor connected for receiving said control signal;

a second power source;

third and fourth transistors of a second conductivity type having current paths which are connected in series between said first node and said second power source, a gate of said third transistor connected with said first signal output terminal, and a gate of said fourth transistor connected for receiving said first input signal;

a second node connected to said first node;

fifth transistor of the first conductivity type connected between said first power source and said second node, a gate of said fifth transistor connected with said first signal output terminal;

sixth and seventh transistors having current paths which are connected between said second node and said second power source, a gate of said sixth transistor connected for receiving said control signal, a gate of said seventh transistor connected to said first signal output terminal;

a third node connected to said first signal output terminal;

a second signal output terminal connected to said second node, for outputting a second output signal;

an eighth transistor of the first conductivity type connected between said first power source and said third node, a gate of said eighth transistor connected with said second signal output terminal;

ninth and tenth transistors of the second conductivity type connected between said third node and said second power source, a gate of said ninth transistor connected for receiving said control signal, and a gate of said tenth transistor connected to said second signal output terminal;

a fourth node connected to said third node;

eleventh and twelfth transistors of the first conductivity type having current paths which are connected in series between said first power source and said fourth node, a gate of said eleventh transistor connected for receiving a second input signal as the inversion of said first input signal, and a gate of said twelfth transistor connected for receiving said control signal; and thirteenth and fourteenth transistors of the second conductivity type having current paths which are connected in series between said fourth node and said second power source, a gate of said thirteenth transistor connected with said second signal output terminal, and a gate of said fourteenth transistor connected for receiving said second input signal;

wherein said first and second latch circuits are connected to form a 1-bit shift register in such a way that said first and second output signals of one of said first and second latch circuits are connected to receive said first and second input signals of the other latch circuit.

13. The shift register according to claim 12, wherein said first power source is at a high potential, said second power source is at a ground potential, said first conductivity type transistors are P channel MOS transistors, and said second conductivity type transistors are N channel MOS transistors.

14. The shift register according to claim 12, wherein said first power source is at a high potential, said second power source is at a ground potential, said first conductivity type transistors are P channel MOS transistors, and said second conductivity type transistors are N channel MOS transistors, said second and fifth transistors in said first latch circuit are replaced by a fifteenth MOS transistor, and said eighth transistor and said twelfth transistor are replaced by a sixteenth MOS transistor.

15. The shift register according to claim 12, wherein said first power source is at a high potential, said second power source is at a ground potential, said first conductivity type transistors are P channel MOS transistors, and said second conductivity type transistors are N channel MOS transistors, said third and seventh transistors in said second latch circuit are replaced by a fifteenth MOS transistor, and said tenth and thirteenth transistors are replaced by a sixteenth MOS transistor.

16. The shift register according to claim 12, wherein said first power source is at a high potential, said second power source is at a ground potential, said first conductivity type transistors are P channel MOS transistors, and said second conductivity type transistors are N channel MOS transistors, said second and fifth transistors in said first latch circuit are replaced by a fifteenth MOS transistor, said eighth and twelfth transistors are replaced by a sixteenth MOS transistor, said third and seventh transistors in said second latch circuit are replaced by a seventeenth MOS transistor, and said tenth and thirteenth transistors are replaced by a eighteenth MOS transistor.

* * * * *